(12) United States Patent
Byun et al.

(10) Patent No.: US 11,983,084 B2
(45) Date of Patent: May 14, 2024

(54) CONTROLLING COOLING PERFORMANCE OF THERMOELECTRIC ELEMENT OF STORAGE DEVICE AND NUMBER OF CHANNELS OR WAYS IN STORAGE DEVICE IN RESPONSE TO TEMPERATURE CHANGES

(71) Applicant: SAMSUNG ELECTRONICS CO., LTD., Suwon-si (KR)

(72) Inventors: Jaebeom Byun, Suwon-si (KR); Eoksoo Shim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 41 days.

(21) Appl. No.: 17/531,204

(22) Filed: Nov. 19, 2021

(65) Prior Publication Data

US 2022/0261326 A1 Aug. 18, 2022

(30) Foreign Application Priority Data

Feb. 15, 2021 (KR) .......................... 10-2021-0019704

(51) Int. Cl.
*G06F 1/26* (2006.01)
*G06F 1/20* (2006.01)
(Continued)

(52) U.S. Cl.
CPC .......... *G06F 11/3058* (2013.01); *G06F 1/206* (2013.01); *G06F 11/3034* (2013.01); *G06F 11/3409* (2013.01)

(58) Field of Classification Search
None
See application file for complete search history.

(56) References Cited

U.S. PATENT DOCUMENTS 6,134,667 A * 10/2000 Suzuki .................... G06F 1/206
361/679.48
7,865,751 B2 1/2011 Monferrer et al.
(Continued)

FOREIGN PATENT DOCUMENTS

| JP | 5303825 | 10/2013 |
| KR | 2044610 | 11/2019 |
| KR | 20200016785 | 2/2020 |

OTHER PUBLICATIONS

Wenli Zheng, Kai Ma, and Xiaorui Wang, TECfan: Coordinating Thermoelectric Cooler, Fan, and DVFS for CMP Energy Optimization, 2016 IEEE International Parallel and Distributed Processing Symposium pp. 423-432 (Year: 2016).*

*Primary Examiner* — Danny Chan
(74) *Attorney, Agent, or Firm* — CHAU & ASSOCIATES, LLC

(57) ABSTRACT

In a method of operating a storage device, temperature information is received from a temperature sensor. At least one power control signal and at least one performance control signal are alternately output based on the temperature information. A first temperature control operation and a second temperature control operation are alternately performed based on the at least one power control signal and the at least one performance control signal. The first temperature control operation is performed to control cooling performance of a thermoelectric element included in the storage device based on the at least one power control signal. The second temperature control operation is performed to control a throttling of operating performance of the storage device based on the at least one performance control signal.

17 Claims, 27 Drawing Sheets

(51) Int. Cl.
*G06F 11/30* (2006.01)
*G06F 11/34* (2006.01)

(56) References Cited

U.S. PATENT DOCUMENTS

| | | | |
|---|---|---|---|
| 9,183,000 | B2 | 11/2015 | Ichida et al. |
| 9,348,380 | B2 | 5/2016 | Ping et al. |
| 9,639,128 | B2 | 5/2017 | Chun |
| 9,763,116 | B2 * | 9/2017 | McCabe ............... G06F 1/3209 |
| 2008/0310099 | A1 * | 12/2008 | Monferrer ............. G06F 1/3206 |
| | | | 361/679.46 |
| 2010/0274953 | A1 * | 10/2010 | Lee ..................... G06F 12/0607 |
| | | | 711/E12.001 |
| 2010/0293305 | A1 * | 11/2010 | Park ........................ G11C 7/04 |
| | | | 711/170 |
| 2013/0159607 | A1 * | 6/2013 | Kyung ................... G11C 5/147 |
| | | | 711/E12.008 |
| 2014/0136827 | A1 * | 5/2014 | Cho ........................ G01K 7/01 |
| | | | 713/1 |
| 2015/0082811 | A1 * | 3/2015 | Rangarajan ............. G06F 1/324 |
| | | | 62/3.7 |
| 2015/0089961 | A1 | 4/2015 | Duzly et al. |
| 2015/0094875 | A1 | 4/2015 | Duzly et al. |
| 2016/0093553 | A1 | 3/2016 | Prakash et al. |
| 2017/0038974 | A1 * | 2/2017 | Keshava ................ G06F 3/0653 |
| 2018/0284857 | A1 | 10/2018 | Yang et al. |
| 2019/0129481 | A1 * | 5/2019 | Daly ................. H05K 7/20836 |
| 2020/0050246 | A1 | 2/2020 | Karalnik et al. |
| 2020/0363104 | A1 * | 11/2020 | MacDonald .............. G06F 1/20 |
| 2021/0271300 | A1 * | 9/2021 | Hsia ....................... G05B 15/02 |
| 2021/0278887 | A1 * | 9/2021 | Lee ......................... G06F 1/206 |

* cited by examiner

900

CONTROLLING COOLING PERFORMANCE OF THERMOELECTRIC ELEMENT OF STORAGE DEVICE AND NUMBER OF CHANNELS OR WAYS IN STORAGE DEVICE IN RESPONSE TO TEMPERATURE CHANGES

CROSS-REFERENCE TO RELATED APPLICATIONS

This application claims priority under 35 U.S.C. § 119 to Korean Patent Application No. 10-2021-0019704, filed on Feb. 15, 2021 in the Korean Intellectual Property Office (KIPO), the contents of which are incorporated by reference herein in their entirety.

TECHNICAL FIELD

Embodiments of the inventive concept relate to a storage device, and more particularly to a method of operating the storage device and a storage device performing the same.

DISCUSSION OF RELATED ART

Certain types of data storage devices may include one or more semiconductor memory devices. Examples of such data storage devices include solid state drives (SSDs), which may enjoy various design and/or performance advantages over hard disk drives (HDDs). Examples of potential advantages include the absence of moving mechanical parts, higher data access speeds, stability, durability, and/or low power consumption. SSDs have been adopted in various systems, such as laptop computers, cars, airplanes, drones, etc.

The behavior of these data storage devices is often very dependent on their operating and storage temperature. In elevated temperatures, an endurance of the storage device may be increased by annealing, but data retention of the storage device is then degraded according to the Arrhenius equation. In exceptionally low temperatures, other degrading effects may be prominent. In addition, while the data storage devices are operating, a large amount of heat may be emitted, and the data storage devices may no longer operate normally if the temperature exceeds a certain limit.

SUMMARY

An embodiment of the inventive concept provides a method of operating a storage device capable of efficiently controlling an operating temperature of the device while minimizing a degradation of the storage device performance.

An embodiment of the inventive concept provides a storage device capable of efficiently controlling an operating temperature of the storage device while minimizing the degradation of the storage device performance.

According to an embodiment of the inventive concept, a method of operating a storage device includes receiving temperature information from a temperature sensor, alternately activating or deactivating at least one power control signal of a plurality of power control signals and at least one performance control signal of a plurality of performance control signals based on the temperature information, and alternately performing a first temperature control operation and a second temperature control operation based on the at least one power control signal and the at least one performance control signal. The first temperature control operation includes controlling a cooling performance of a thermoelectric element included in the storage device based on the at least one power control signal, and the second temperature control operation includes controlling a throttling of an operating performance of the storage device based on the at least one performance control signal.

According to an embodiment of the inventive concept, a storage device includes a temperature sensor configured to output temperature information, a thermoelectric element configured to control an operating temperature of the storage device, a thermoelectric element controller configured to activate or deactivate at least one power control signal of a plurality of power control signals based on the temperature information, and to control a cooling performance of the thermoelectric element by performing a first temperature control operation based on the at least one power control signal, and a storage controller configured to output at least one performance control signal based on the temperature information, and to control a throttling of an operating performance of the storage device by performing a second temperature control operation based on the at least one performance control signal. The at least one power control signal and the at least one performance control signal are alternately activated or deactivated, and the first temperature control operation and the second temperature control operation are alternately performed.

According to an embodiment of the inventive concept, a method of operating a storage device includes periodically receiving temperature information from a temperature sensor included in the storage device, activating a first power control signal in response to determining that an operating temperature of the storage device increases to a first temperature based on the temperature information, driving a thermoelectric element included in the storage device based on the activated first power control signal such that the thermoelectric element operates with a first cooling performance, activating a first performance control signal in response to determining that the operating temperature of the storage device increases to second temperature higher than the first temperature based on the temperature information, decreasing an operating performance of the storage device from a first operating performance to a second operating performance based on the activated first performance control signal, activating a second power control signal in response to determining that the operating temperature of the storage device increases to a third temperature that is higher than the second temperature based on the temperature information, driving the thermoelectric element based on the activated second power control signal such that the thermoelectric element operates with a second cooling performance that is higher than the first cooling performance, activating a second performance control signal in response to determining that the operating temperature of the storage device increases to a fourth temperature that is higher than the third temperature based on the temperature information, decreasing the operating performance of the storage device from the second operating performance to a third operating performance based on the activated second performance control signal, deactivating the second performance control signal in response to determining that the operating temperature of the storage device decreases to the second temperature after the operating temperature of the storage device increases to the fourth temperature based on the temperature information, increasing the operating performance of the storage device from the third operating performance to the second operating performance based on the deactivated second performance control signal, deactivating the second power control signal in response to determining that the operating temperature of the storage device decreases to the first temperature based on the temperature information, and driving the thermoelectric element based on the deactivated second power control signal such that the thermoelectric element operates with the first cooling performance that is lower than the second cooling performance.

BRIEF DESCRIPTION OF THE DRAWINGS

The above and other features of the inventive concept will become more apparent by describing in detail embodiments thereof with reference to the accompanying drawings, in which.

DETAILED DESCRIPTION

Figure 1:
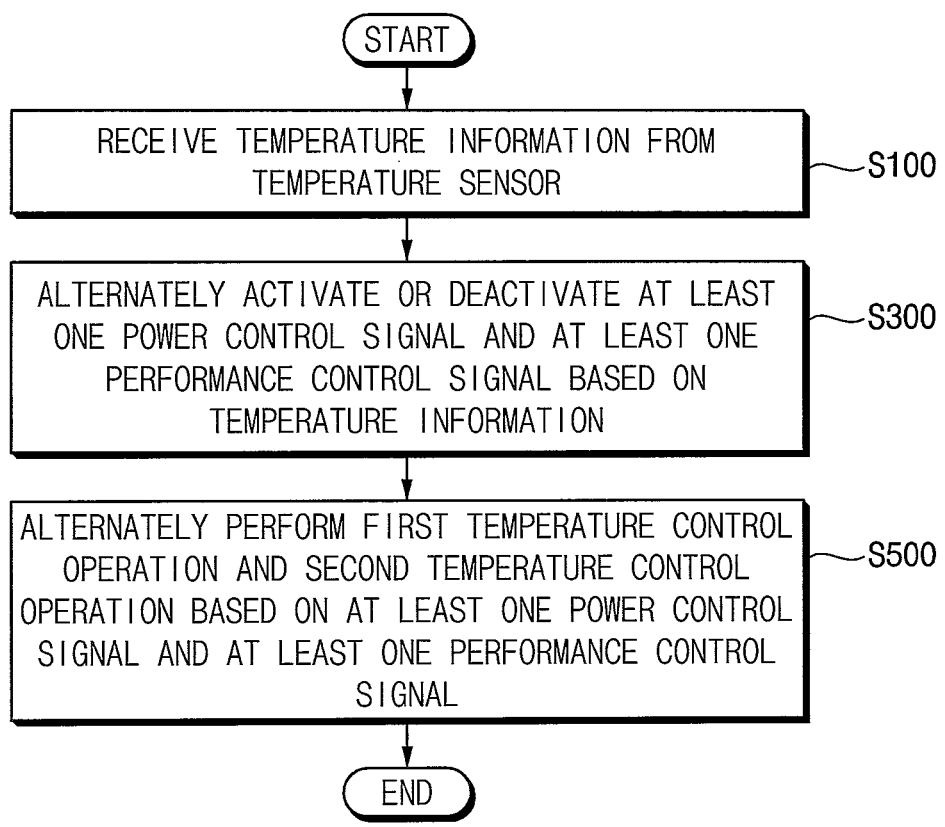
FIG. 1 is a flowchart of a method of operating a storage device according to an embodiment of the inventive concept.

Various embodiments of the inventive concept will be described more fully hereinafter with reference to the accompanying drawings Like reference numerals refer to like elements throughout this application.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, a first element, component, region, layer, or section discussed below could be termed a second element, component, region, layer, or section without departing from the teachings of the present disclosure.

As used herein, the singular forms "a," "an", and "the" are intended to include the plural forms as well, unless the context clearly indicates otherwise.

Herein, when one value is described as being about equal to another value or being substantially the same as or equal to another value, it is to be understood that the values are equal to each other to within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

FIG. 1 is a flowchart of a method of operating a storage device according to an embodiment of the inventive concept.

FIG. 1 illustrates a method of operating a storage device. The method may be performed by a storage device that may include a plurality of nonvolatile memories storing data and a storage controller controlling an operation of the plurality of nonvolatile memories. The storage device may also include a temperature sensor measuring temperature, a thermoelectric element that performs a cooling function for temperature control, and a thermoelectric element controller that may control the cooling function of the thermoelectric element by a temperature control operation. The storage device and a storage system including the storage device will be further described with reference to FIGS. 2 through 5.

Referring to FIG. 1, temperature information may be received from a temperature sensor (step S100). For example, the temperature sensor may periodically measure an operating temperature of the storage device and may periodically output the temperature information including the operating temperature of the storage device. The temperature information may be provided to the storage controller and the thermoelectric element controller. For example, the temperature sensor may output the temperature information in response to a request from the storage controller and the thermoelectric element controller. In an embodiment, the storage controller and/or the thermoelectric element controller may perform step S100.

At least one power control signal of a plurality of power control signals and at least one performance control signal of a plurality of performance control signals may be alternately activated or deactivated based on the temperature information (step S300). For example, the at least one power control signal may control a cooling performance of the thermoelectric element. When the operating temperature of the storage device increases (or rises) or decreases (or falls) to a reference temperature of a plurality of reference temperatures, the thermoelectric element controller may activate or deactivate the at least one power control signal. For example, the at least one performance control signal may be used to control operating performance of the storage device. When the operating temperature of the storage device increases or decreases to the reference temperature, the storage controller may activate or deactivate the at least one performance control signal. In an embodiment, the storage controller and/or the thermoelectric element controller may perform step S300. Step S300 will be described in further detail with reference to FIG. 8.

In an embodiment, a reference temperature for activating or deactivating the at least one power control signal may be different from a reference temperature for activating or deactivating the at least one performance control signal, and the at least one power control signal and the at least one performance control signal may be alternately activated or deactivated. For example, when the operating temperature of the storage device increases, the above-described alternating signal activation or deactivation operation may be performed by activating a first power control signal of the plurality of power control signals, then activating a first performance control signal of the plurality of performance control signals, then activating a second power control signal of the plurality of power control signals, and then activating a second performance control signal the plurality of performance control signals. For example, when the operating temperature of the storage device decreases, the above-described alternating signal activation or deactivation operation may be performed by deactivating the second performance control signal, then deactivating the second power control signal, then deactivating the first performance control signal, and then deactivating the first power control signal.

A first temperature control operation and a second temperature control operation may be alternately performed based on the plurality of power control signals and the plurality of performance control signals (step S500). The first temperature control operation may control the cooling performance of the thermoelectric element based on a power control signal of the plurality of power control signals, and the second temperature control operation may control a throttling of the operating performance of the storage device based on a performance control signal of the plurality of performance control signals. The throttling of the operating performance of the storage device may be referred to as thermal throttling or dynamic thermal throttling (DTT). In an embodiment, step S500 may be performed by the storage controller and or the thermoelectric element controller. Step S500 will be described in further detail with reference to FIG. 9.

In an embodiment, when (or as) the operating temperature of the storage device increases, the cooling performance of the thermoelectric element may be increased by performing the first temperature control operation based on a power control signal of the plurality of power control signals, and the operating performance of the storage device may be decreased by performing the second temperature control operation based on a performance control signal of the plurality of power control signals. As described above, when the operating temperature of the storage device increases, the alternating signal activation or deactivation operation may be performed by activating the power control signal first and then activating the performance control signal. Thus, when the operating temperature of the storage device increases, the first temperature control operation may be performed first, and then the second temperature control operation may be performed later.

In an embodiment, when the operating temperature of the storage device decreases after the cooling performance of the thermoelectric element is increased and the operating performance of the storage device is decreased, the cooling performance of the thermoelectric element may be decreased by performing the first temperature control operation based on the a power control signal of the plurality of power control signals, and the operating performance of the storage device may be increased by performing the second temperature control operation based on the a performance control signal of the plurality of performance control signals. As described above, when the operating temperature of the storage device decreases, the alternating signal activation or deactivation operation may be performed by deactivating the performance control signal first and then by deactivating the power control signal. Thus, when the operating temperature of the storage device decreases, the second temperature control operation may be performed first, and then the first temperature control operation may be performed later.

In the method of operating the storage device, the temperature control of the storage device may be performed via both the throttling of the operating performance and the cooling performance of the thermoelectric element. For example, when the operating temperature of the storage device increases and reaches a reference temperature of the plurality of reference temperatures, the throttling of the operating performance in which the operating performance of the storage device is decreased gradually (or step-wise or step-by-step) may be performed, and a temperature control operation in which the cooling performance of the thermoelectric element is increased gradually may be additionally performed. In addition, the temperature control operation and the throttling of the operating performance may be alternately performed in time, and the thermoelectric element may be preemptively driven before the throttling of the operating performance is performed. Accordingly, the thermal response of the storage device may be improved by controlling the operating temperature of the storage device rapidly and minimizing the operating performance of the storage device, and the power consumption of the thermoelectric element may also thereby be minimized.

Figure 2:
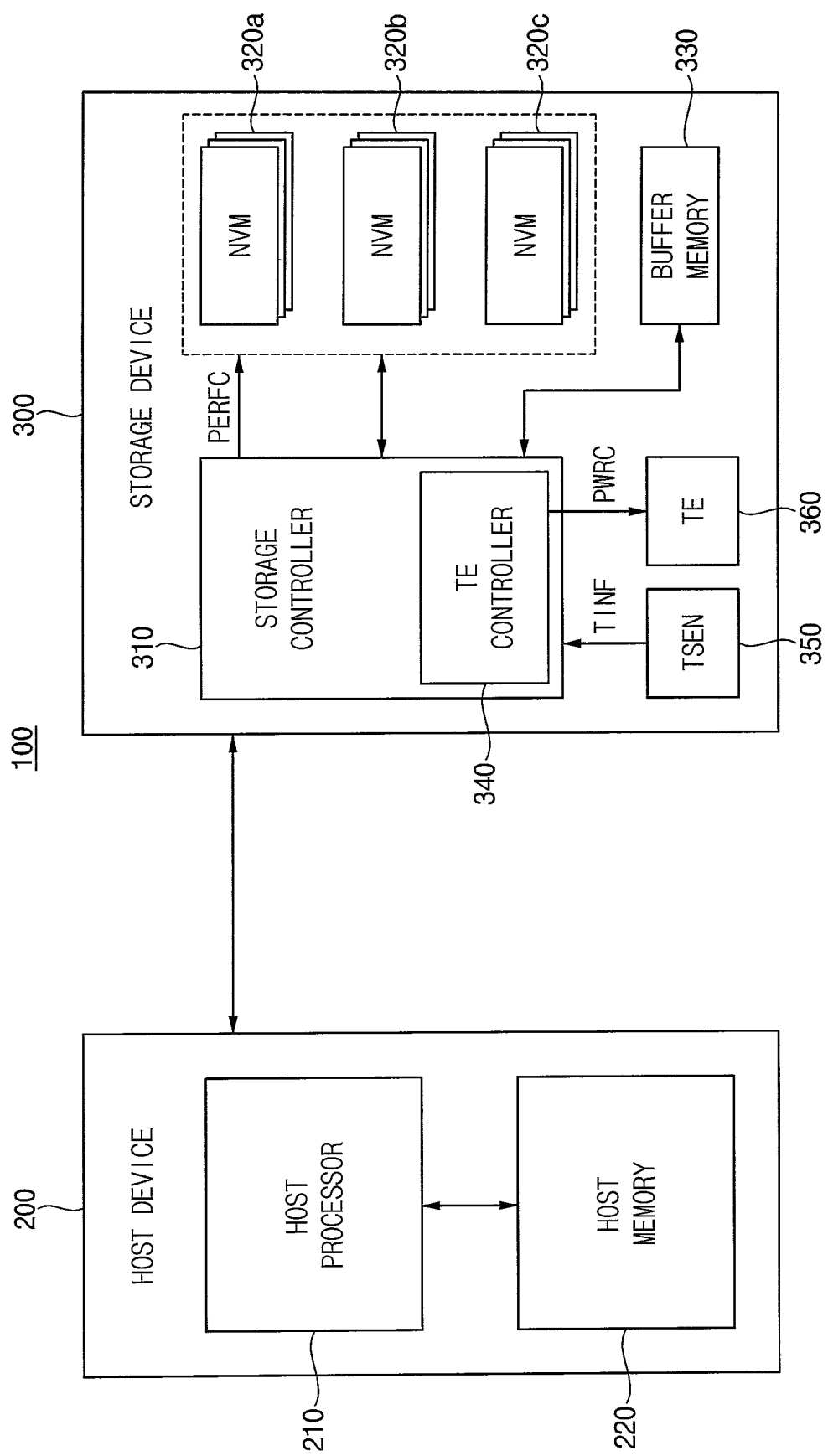
FIG. 2 is a block diagram of a storage device and a storage system including the storage device according to an embodiment of the inventive concept.

FIG. 2 is a block diagram of a storage device and a storage system including the storage device according to an embodiment of the inventive concept.

Referring to FIG. 2, a storage system 100 includes a host device 200 and a storage device 300.

The host device 200 may control overall operations of the storage system 100. The host device 200 may include a host processor 210 and a host memory 220.

The host processor 210 may control an operation of the host device 200. For example, the host processor 210 may execute an operating system (OS). For example, the operating system may include a file system that performs file management and a device driver that controls peripheral devices such as the storage device 300 at the operating system level. For example, the host processor 210 may include at least one of various processing units such as a central processing unit (CPU) or the like.

The host memory 220 may store instructions and/or data that are executed and/or processed by the host processor 210. For example, the host memory 220 may include at least one of various volatile memories such as a dynamic random access memory (DRAM) or the like.

The storage device 300 is accessed by the host device 200. The storage device 300 may include a storage controller 310, a plurality of nonvolatile memories (NVMs) 320a, 320b and 320c, a buffer memory 330, a temperature sensor (TSEN) 350, a thermoelectric element (TE) 360, and a thermoelectric element controller 340.

The storage controller 310 may control an operation of the storage device 300 such as a data write operation and/or a data read operation based on a command and data that are received from the host device 200.

The temperature sensor 350 may output temperature information TINF representing a change in the operating temperature of the storage device 300. For example, the temperature sensor 350 may periodically output the temperature information TINF based on a counter and/or a timer. The temperature sensor 350 may provide the temperature information TINF to the storage controller 310 and the thermoelectric element controller 340.

The thermoelectric element 360 may control the operating temperature of the storage device 300. For example, the thermoelectric element 360 may cool the storage device 300 by decreasing the operating temperature of the storage device 300, and may be referred to as a thermoelectric cooler (TEC). The cooling performance of the thermoelectric element 360 may be proportional to a voltage level of an operating voltage of the thermoelectric element 360. A thermoelectric element will be described in further detail with reference to FIGS. 6 and 7.

The thermoelectric element controller 340 may control the thermoelectric element 360. For example, the thermoelectric element controller 340 may activate and deactivate the thermoelectric element 360 and may control the cooling performance of the thermoelectric element 360. In an embodiment, the thermoelectric element controller 340 may include a voltage regulator, a power management integrated circuit (PMIC), and/or the like. In an embodiment, the thermoelectric element controller 340 may be disposed in the storage controller 310.

The storage controller 310, the thermoelectric element controller 340, the temperature sensor 350, and the thermoelectric element 360 may perform the method of operating the storage device described with reference to FIG. 1. For example, the thermoelectric element controller 340 may activate or deactivate at least one power control signal PWRC of the plurality of power control signals based on the temperature information TINF, and may control the cooling performance of the thermoelectric element 360 by performing a first temperature control operation based on the at least one power control signal PWRC. The storage controller 310 may activate or deactivate at least one performance control signal PERFC of the plurality of performance control signals based on the temperature information TINF, and may control the operating performance of the storage device 300 by performing a second temperature control operation based on the at least one performance control signal PERFC. The at least one power control signal PWRC and the at least one performance control signal PERFC may be alternately activated or deactivated in an alternating signal operation, and the first temperature control operation and the second temperature control operation may be alternately performed based on the alternating signal output operation.

The plurality of nonvolatile memories 320a, 320b, and 320c may store data. For example, the data may include metadata, various user data, and/or the like.

In an embodiment, each nonvolatile memory of the plurality of nonvolatile memories 320a, 320b, and 320c may include a NAND flash memory. In an embodiment, each nonvolatile memory of the plurality of nonvolatile memories 320a, 320b, and 320c may include one of an electrically erasable programmable read-only memory (EEPROM), a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), or the like.

The buffer memory 330 may store instructions and/or data that are executed and/or processed by the storage controller 310, and may temporarily store data stored in or to be stored in the plurality of nonvolatile memories 320a, 320b, and 320c. For example, the buffer memory 330 may include at least one of various volatile memories such as a static random access memory (SRAM), a DRAM, or the like.

In an embodiment, the storage device 300 may be a solid state drive (SSD). In an embodiment, the storage device 300 may be a universal flash storage (UFS), a multi-media card (MMC), or an embedded multi-media card (eMMC). In an embodiment, the storage device 300 may be one of a secure digital (SD) card, a micro SD card, a memory stick, a chip card, a universal serial bus (USB) card, a smart card, a compact flash (CF) card, or the like.

In an embodiment, the storage controller 310, the plurality of nonvolatile memories 320a, 320b, and 320c, and the buffer memory 330 may be implemented as at least one semiconductor chip. For example, the at least one semiconductor chip may be implemented as a semiconductor package. For example, each of the storage controller 310 and the buffer memory 330 may be implemented as a semiconductor package, and the plurality of nonvolatile memories 320a, 320b, and 320c may be implemented as a plurality of semiconductor packages.

In an embodiment, the storage device 300 may be connected to the host device 200 via a block accessible interface that may include, for example, a UFS, an eMMC, a serial advanced technology attachment (SATA) bus, a nonvolatile memory express (NVMe) bus, a serial attached SCSI (SAS) bus, or the like. The storage device 300 may allow units of a memory block to access data stored in the plurality of nonvolatile memories 320a, 320b, and 320c by providing the block accessible interface to the host device 200 based on a block accessible address space corresponding to an access size of the plurality of nonvolatile memories 320a, 320b, and 320c.

In an embodiment, the storage system 100 may be a computing system such as a personal computer (PC), a server computer, a data center, a workstation, a digital television, a set-top box, a navigation system, or the like. In an embodiment, the storage system 100 may be a mobile system such as a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, or the like.

Figure 3:
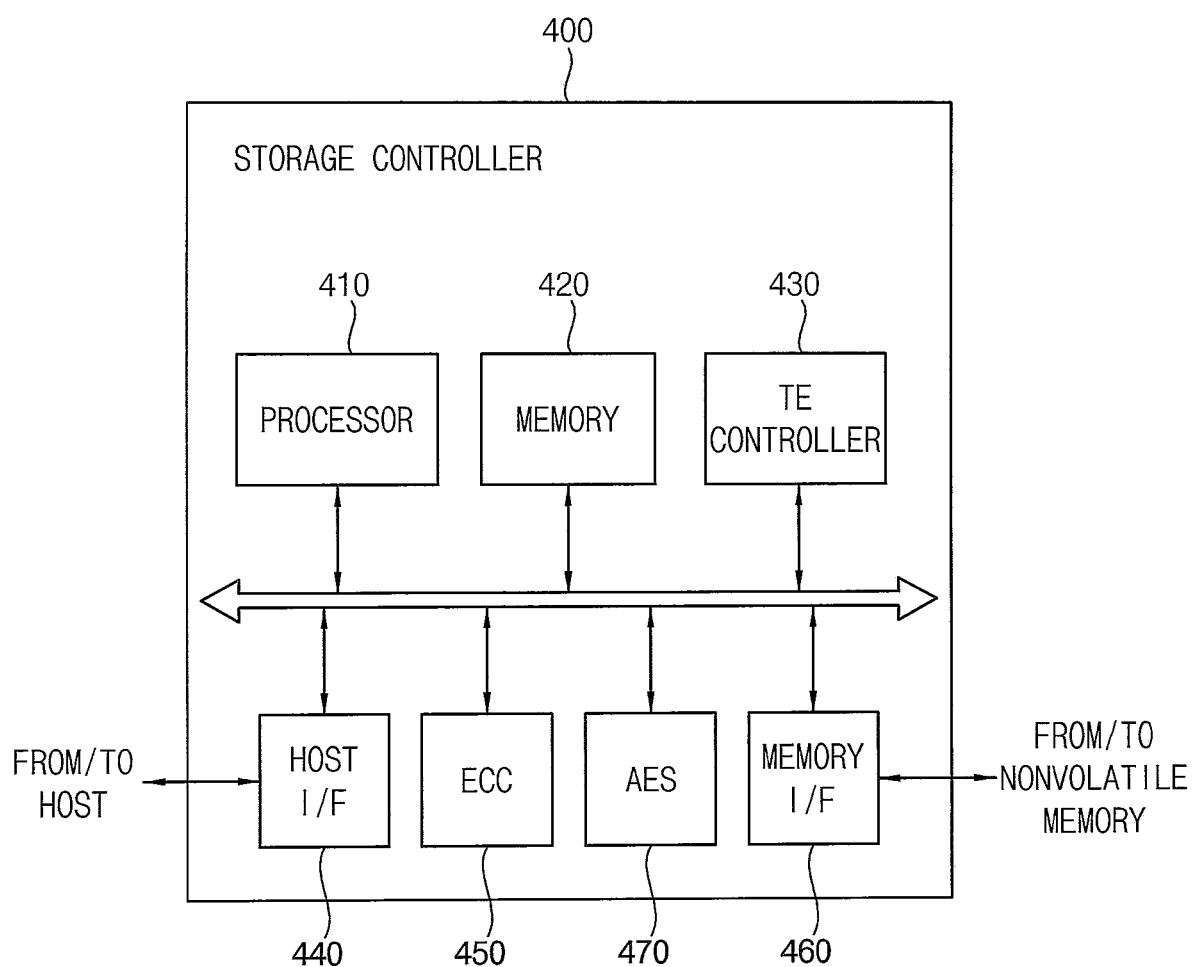
FIG. 3 is a block diagram of a storage controller included in a storage device according to an embodiment of the inventive concept.

FIG. 3 is a block diagram of a storage controller included in a storage device according to an embodiment of the inventive concept.

Referring to FIG. 3, a storage controller 400 may include a processor 410, a memory 420, a thermoelectric element controller 430, a host interface 440, an error correction code (ECC) engine 450, a memory interface 460, and an advanced encryption standard (AES) engine 470. The storage controller 400 may be implemented as the storage controller 310.

The processor 410 may control an operation of the storage controller 400 in response to a command received via the host interface 440 from a host device (e.g., the host device 200 in FIG. 2). For example, the processor 410 may control an operation of a storage device (e.g., the storage device 300 in FIG. 2), and may control components of the storage device by controlling firmware of the storage device.

The memory 420 may store instructions and data executed and processed by the processor 410. For example, the memory 420 may be implemented as a volatile memory such as a DRAM, a SRAM, a cache memory, or the like.

The thermoelectric element controller 430 may be substantially the same as the thermoelectric element controller 340 in FIG. 2. In an embodiment, at least a portion of the thermoelectric element controller 430 may be implemented as hardware. For example, at least a portion of the thermoelectric element controller 430 may be included in a computer-based electronic system. In an embodiment, at least a portion of the thermoelectric element controller 430 may be implemented as instruction codes or program routines (e.g., a software program). For example, the instruction codes or the program routines may be executed by a computer-based electronic system, and may be stored in any storage device located inside or outside the computer-based electronic system.

The ECC engine 450 may perform error correction by performing coded modulation using a Bose-Chaudhuri-Hocquenghem (BCH) code, a low density parity check (LDPC) code, a turbo code, a Reed-Solomon code, a convolution code, a recursive systematic code (RSC), a trellis-coded modulation (TCM), a block coded modulation (BCM), or the like, or may perform ECC encoding and ECC decoding using above-described codes or other error correction codes.

The host interface 440 may provide physical connections between the host device and the storage device. The host interface 440 may provide an interface corresponding to a bus format of the host device for communication between the host device and the storage device. In an embodiment, the bus format of the host device may be a small computer system interface (SCSI) or a serial attached SCSI (SAS) interface. In an embodiment, the bus format of the host device may be a USB format, a peripheral component interconnect (PCI) express (PCIe) format, an advanced technology attachment (ATA) format, a parallel ATA (PATA) format, a serial ATA (SATA) format, a nonvolatile memory (NVM) express (NVMe) format, or the like.

The memory interface 460 may exchange data with a nonvolatile memory (e.g., the nonvolatile memories 320a, 320b, and 320c in FIG. 2). The memory interface 460 may transfer data to the nonvolatile memory, or may receive data read from the nonvolatile memory. In an embodiment, the memory interface 460 may be connected to the nonvolatile memory via one channel. In an embodiment, the memory interface 460 may be connected to the nonvolatile memory via two or more channels. For example, the memory interface 460 may comply with a standard protocol such as Toggle or open NAND flash interface (ONFI).

The AES engine 470 may perform at least one of an encryption operation and a decryption operation on data input to the storage controller 400 by using a symmetric-key algorithm. The AES engine 470 may include an encryption module and a decryption module. In an embodiment, the encryption module and the decryption module may be implemented as separate modules. In an embodiment, one module capable of performing both encryption and decryption operations may be implemented in the AES engine 470.

Figure 4:
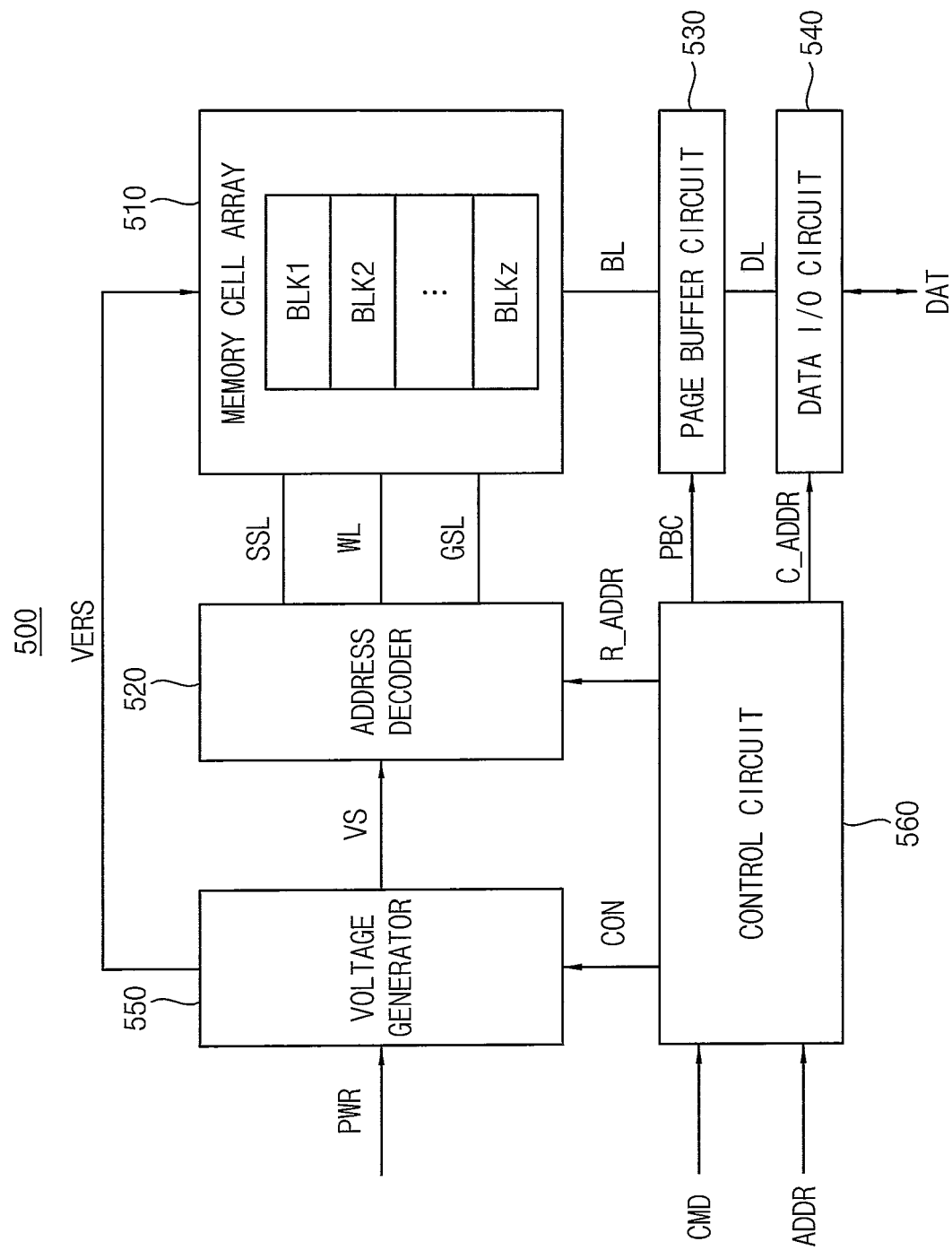
FIG. 4 is a block diagram of a nonvolatile memory included in a storage device according to an embodiment of the inventive concept.

FIG. 4 is a block diagram of a nonvolatile memory included in a storage device according to an embodiment of the inventive concept.

Referring to FIG. 4, a nonvolatile memory 500 includes a memory cell array 510, an address decoder 520, a page buffer circuit 530, a data I/O circuit 540, a voltage generator 550 and a control circuit 560. The nonvolatile memory 500 may be implemented as a nonvolatile memory of the plurality of nonvolatile memories 320a, 320b, and 320c.

The memory cell array 510 is connected to the address decoder 520 via a plurality of string selection lines SSL, a plurality of wordlines WL, and a plurality of ground selection lines GSL. The memory cell array 510 is further connected to the page buffer circuit 530 via a plurality of bitlines BL. The memory cell array 510 may include a plurality of memory cells (e.g., a plurality of nonvolatile memory cells) connected to the plurality of wordlines WL and the plurality of bitlines BL. The memory cell array 510 may be divided into a plurality of memory blocks BLK1 to BLKz, and each memory block of the plurality of memory blocks BLK1 to BLKz may include memory cells. Each memory block of the plurality of memory blocks BLK1 to BLKz may be divided into a plurality of pages.

In an embodiment, the plurality of memory cells included in the memory cell array 510 may be arranged in a two-dimensional (2D) array structure or a three-dimensional (3D) vertical array structure. The 3D vertical array structure may include vertical cell strings that are vertically oriented such that at least one memory cell is located above another memory cell. The at least one memory cell may comprise a charge trap layer. U.S. Pat. Nos. 7,679,133, 8,553,466, 8,654,587, 8,559,235, and US Pat. Pub. No. 2011/0233648, describe suitable configurations for a memory cell array that includes a 3D vertical array structure in which the three-dimensional memory array is configured as a plurality of levels with wordlines and/or bitlines shared between levels, and are hereby incorporated by reference in their entirety.

The control circuit 560 may receive a command CMD and an address ADDR from outside the nonvolatile memory 500 (e.g., from the storage controller 310 of FIG. 2), and may control data erase, program (i.e., write), and read operations of the nonvolatile memory 500 based on the command CMD and the address ADDR. A data erase operation may include performing a sequence of erase loops, and a data program operation may include performing a sequence of program loops. Each program loop may include a program operation and a program verification operation. Each erase loop may include an erase operation and an erase verification operation. The data read operation may include a normal read operation and a data recover read operation.

For example, the control circuit 560 may generate control signals CON for controlling the voltage generator 550 and may generate control signal PBC for controlling the page buffer circuit 530 based on the command CMD, and may generate a row address R_ADDR and a column address C_ADDR based on the address ADDR. The control circuit 560 may provide the row address R_ADDR to the address decoder 520 and may provide the column address C_ADDR to the data I/O circuit 540.

The address decoder 520 may be connected to the memory cell array 510 via the plurality of string selection lines SSL, the plurality of wordlines WL, and the plurality of ground selection lines GSL.

For example, in the data erase, write (i.e., program), and read operations, the address decoder 520 may determine at least one wordline of the plurality of wordlines WL as a selected wordline, and may determine the rest or remainder of the plurality of wordlines WL other than the selected wordline as unselected wordlines, based on the row address R_ADDR.

For example, in the data erase, write, and read operations, the address decoder 520 may determine at least one string selection line of the plurality of string selection lines SSL as a selected string selection line, and may determine the rest or remainder of the plurality of string selection lines SSL other than the selected string selection line as unselected string selection lines, based on the row address R_ADDR.

For example, in the data erase, write, and read operations, the address decoder 520 may determine at least one ground selection line of the plurality of ground selection lines GSL as a selected ground selection line, and may determine the rest or remainder of the plurality of ground selection lines GSL other than the selected ground selection line as unselected ground selection lines, based on the row address R_ADDR.

The voltage generator 550 may generate voltages VS for an operation of the nonvolatile memory 500 based on a power PWR and the control signals CON. The voltages VS may be provided to the plurality of string selection lines SSL, the plurality of wordlines WL, and the plurality of ground selection lines GSL via the address decoder 520. In addition, the voltage generator 550 may generate an erase voltage VERS for the data erase operation based on the power PWR and the control signals CON. The erase voltage VERS may be provided to the memory cell array 510 directly or via the bitline BL.

For example, during the erase operation, the voltage generator 550 may provide the erase voltage VERS to a common source line and/or a bitline BL of a memory block (e.g., a selected memory block) and may provide an erase permission voltage (e.g., a ground voltage) to the wordlines of the memory block or a group of the wordlines of the memory block via the address decoder 520. In addition, during the erase verification operation, the voltage generator 550 may provide an erase verification voltage simultaneously to the wordlines of the memory block or sequentially to the wordlines of the memory block one by one.

For example, during the program operation, the voltage generator 550 may provide a program voltage to the selected wordline and may provide a program pass voltage to the unselected wordlines via the address decoder 520. In addition, during the program verification operation, the voltage generator 550 may provide a program verification voltage to the selected wordline and may provide a verification pass voltage to the unselected wordlines via the address decoder 520.

For example, during the normal read operation, the voltage generator 550 may provide a read voltage to the selected wordline and may provide a read pass voltage to the unselected wordlines via the address decoder 520. During the data recover read operation, the voltage generator 550 may provide the read voltage to a wordline adjacent to the selected wordline and may provide a recover read voltage to the selected wordline via the address decoder 520.

The page buffer circuit 530 may be connected to the memory cell array 510 via the plurality of bitlines BL. The page buffer circuit 530 may include a plurality of page buffers. In an embodiment, each page buffer of the plurality of page buffers may be respectively connected to a bitline of the plurality of bitlines BL. In an embodiment, each page buffer of the plurality of page buffers may be respectively connected to two or more bitlines of the plurality of bitlines BL.

The page buffer circuit 530 may store data DAT to be programmed into the memory cell array 510 or may read data DAT sensed from the memory cell array 510. In other words, the page buffer circuit 530 may operate as a write driver or a sensing amplifier based on an operation mode of the nonvolatile memory 500.

The data I/O circuit 540 may be connected to the page buffer circuit 530 via data lines DL. The data I/O circuit 540 may provide data DAT received from outside of the nonvolatile memory 500 to the memory cell array 510 via the page buffer circuit 530, or may provide the data DAT from the memory cell array 510 to outside of the nonvolatile memory 500, based on the column address C_ADDR.

In an embodiment, the nonvolatile memory 500 may be a NAND flash memory, but the nonvolatile memory 500 may alternatively be a nonvolatile memory such as a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), or the like.

Figure 5:
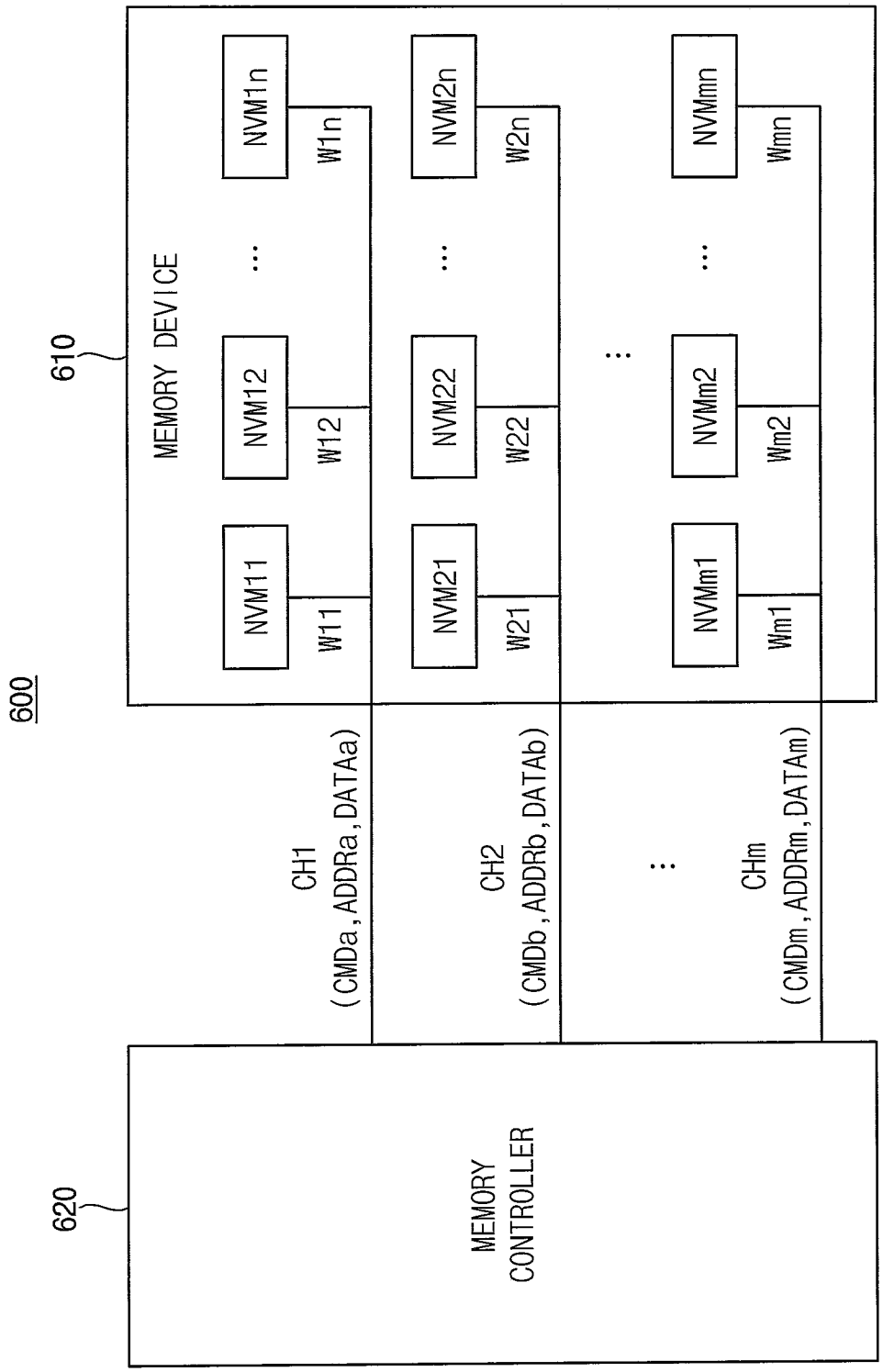
FIG. 5 is a block diagram of a nonvolatile memory device and a memory system including the nonvolatile memory device according to an embodiment of the inventive concept.

FIG. 5 is a block diagram of a nonvolatile memory device and a memory system including the nonvolatile memory device according to an embodiment of the inventive concept.

Referring to FIG. 5, a memory system 600 may include a nonvolatile memory device 610 and a memory controller 620. The memory system 600 may support a plurality of channels CH1 to CHm, and the nonvolatile memory device 610 may be connected to the memory controller 620 through the plurality of channels CH1 to CHm. For example, the memory system 600 may be implemented as a storage device, such as a solid state drive (SSD), a universal flash storage (UFS), or the like, and may be implemented as the storage device 300 of FIG. 2.

The memory device 610 may include a plurality of nonvolatile memories NVM11 to NVM1n, NVM21 to NVM2n, and NVMm1 to NVMmn (i.e., NVM11 to NVMmn). For example, the plurality of nonvolatile memories NVM II to NVMmn may be implemented as the plurality of nonvolatile memories 320a, 320b, and 320c of FIG. 2. Each nonvolatile memory of the plurality of nonvolatile memories NVM11 to NVMmn may be respectively connected to a channel of the plurality of channels CH1 to CHm through a way of a plurality of ways corresponding to the nonvolatile memory and the channel. For instance, the nonvolatile memories NVM11 to NVM1n of the plurality of nonvolatile memories NVM11 to NVMmn may be connected to the first channel CH1 of the plurality of channels CH1 to CHm through ways W11 to W1n of the plurality of ways, the nonvolatile memories NVM21 to NVM2n of the plurality of nonvolatile memories NVM11 to NVMmn may be connected to the second channel CH2 of the plurality of channels CH1 to CHm through ways W21 to W2n of the plurality of ways, and the nonvolatile memories NVMm1 to NVMmn of the plurality of nonvolatile memories NVM11 to NVMmn may be connected to the m-th channel CHm of the plurality of channels CH1 to CHm through ways Wm1 to Wmn of the plurality of ways. In an embodiment, each nonvolatile memory of the plurality of nonvolatile memories NVM11 to NVMmn may be implemented as a memory unit that may operate based on an individual command from the memory controller 620. In an embodiment, each nonvolatile memory of the plurality of nonvolatile memories NVM11 to NVMmn may be implemented as a chip or a die, but embodiments of the inventive concept are not necessarily limited thereto.

The memory controller 620 may transmit and receive signals to and from the memory device 610 through the plurality of channels CH1 to CHm. For example, the memory controller 620 may be implemented as the storage controller 310 in FIG. 2. For example, the memory controller 620 may transmit commands CMDa to CMDm, addresses ADDRa to ADDRm, and data DATA to DATAm to the memory device 610 through the plurality of channels CH1 to CHm, or may receive the data DATAa to DATAm from the memory device 610 through the plurality of channels CH1 to CHm.

The memory controller 620 may select nonvolatile memories of the plurality of nonvolatile memories NVM11 to NVMmn connected to each channel of the plurality of channels CH1 to CHm via the channels, and may transmit and receive signals to and from the selected nonvolatile memories. For example, the memory controller 620 may select the nonvolatile memory NVM11 of the plurality of nonvolatile memories NVM11 to NVM1n connected to the first channel CH1. The memory controller 620 may transmit the command CMDa, the address ADDRa, and the data DATAa to the selected nonvolatile memory NVM11 through the first channel CH1 or may receive the data DATAa from the selected nonvolatile memory NVM11.

The memory controller 620 may transmit and receive signals to and from the memory device 610 in parallel through channels of the plurality of channels CH1 to CHm. For example, the memory controller 620 may transmit the command CMDb to the memory device 610 through the second channel CH2 of the plurality of channels CH1 to CHm while transmitting the command CMDa to the memory device 610 through the first channel CH1. For example, the memory controller 620 may receive the data DATAb from the memory device 610 through the second channel CH2 while receiving the data DATAa from the memory device 610 through the first channel CH1.

The memory controller 620 may control overall operations of the memory device 610. For example, the memory controller 620 may transmit a signal to the plurality of channels CH1 to CHm and may thereby control each nonvolatile memory of the nonvolatile memories NVM11 to NVMmn connected to the plurality of channels CH1 to CHm. For example, the memory controller 620 may transmit the command CMDa and the address ADDRa to the first channel CH1 and may control a nonvolatile memory selected from among the plurality of nonvolatile memories NVM11 to NVM1n.

Each nonvolatile memory of the plurality of nonvolatile memories NVM11 to NVMmn may operate under the control of the memory controller 620. For example, the nonvolatile memory NVM11 may program the data DATAa based on the command CMDa, the address ADDRa, and the data DATAa provided from the memory controller 620 through the first channel CH1. For example, the nonvolatile memory NVM21 of the plurality of nonvolatile memories NVM11 to NVMmn may read the data DATAb based on the command CMDb and the address ADDRb provided from the memory controller 620 through the second channel CH2 and may transmit the read data DATAb to the memory controller 620 through the second channel CH2.

Although FIG. 5 illustrates an embodiment in which the memory device 610 communicates with the memory controller 620 through m channels and includes n nonvolatile memories corresponding to each of the plurality of channels CH1 to CHm, in an embodiment, the number of channels and the number of nonvolatile memories connected to one channel may be variously changed.

Figure 6:
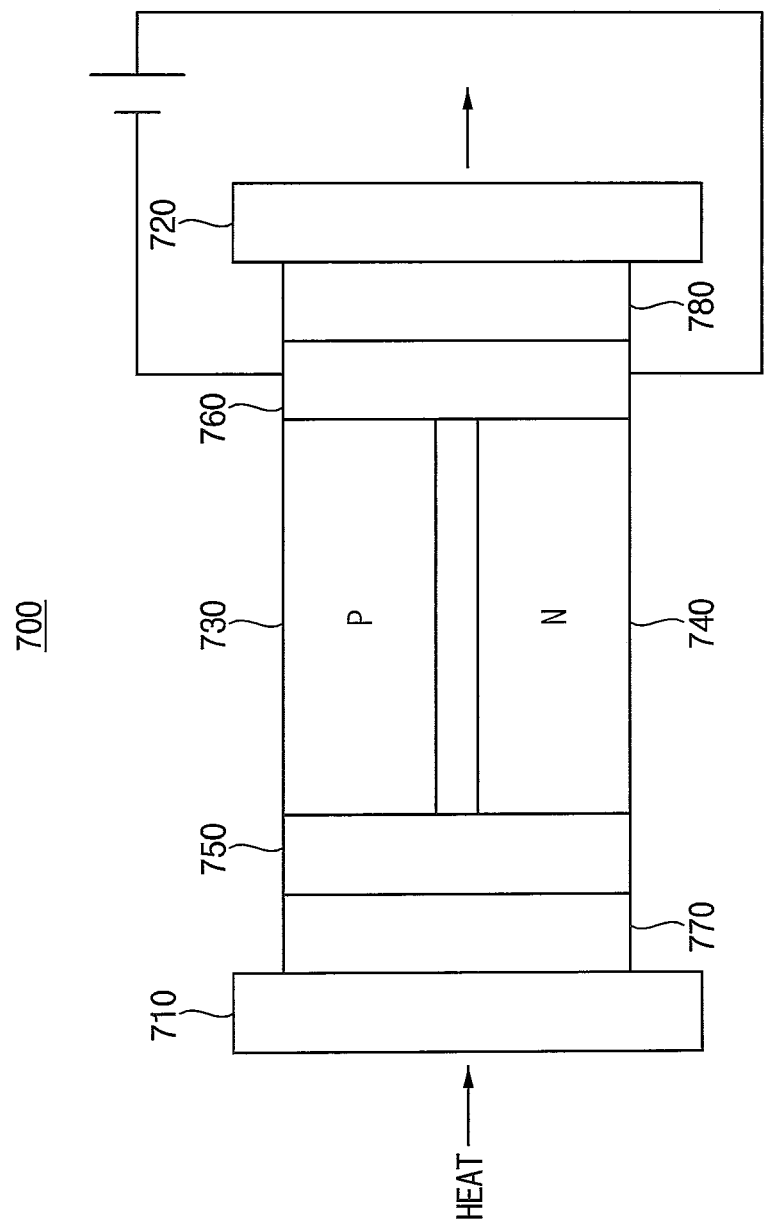
FIG. 6 is a diagram of a thermoelectric element included in a storage device according to an embodiment of the inventive concept.
Figure 7:
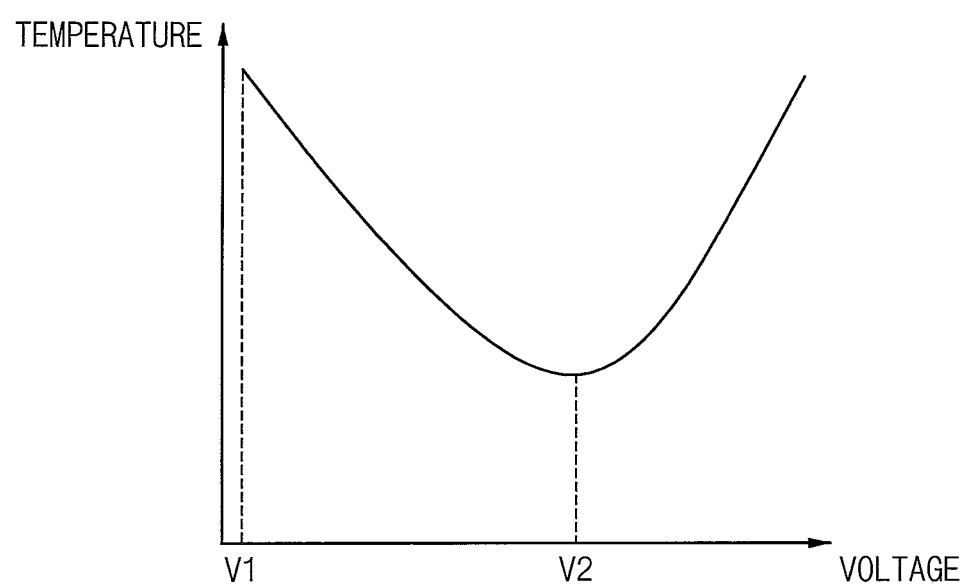
FIG. 7 is a diagram illustrating an operation of the thermoelectric element of FIG. 6.

FIG. 6 is a diagram of a thermoelectric element included in a storage device according to an embodiment of the inventive concept, and FIG. 7 is a diagram illustrating an operation of the thermoelectric element of FIG. 6.

Referring to FIG. 6, a thermoelectric element 700 may include semiconductors 730 and 740, thermally conducting plates 750 and 760, and insulators 770 and 780. The thermoelectric element 700 may be implemented as the thermoelectric element 360.

The thermoelectric element 700 may include a first side and a second side. A direct current (DC) current may flow through the thermoelectric element 700 and consequently transfer heat from the first side to the second side, and therefore the first side may become cooler while the second side may become hotter. The first side may be attached to a cooling plate 710, and the second side may be attached to a heating plate 720. The thermoelectric element 700 may include two unique semiconductors 730 and 740 (e.g., a p-type semiconductor 730 and an n-type semiconductor 740) including different electron densities from each other. The semiconductors 730 and 740 may be arranged thermally in parallel to each other and electrically in series to each other and may be joined by a first thermally conducting plate 750 disposed on a first side of the semiconductors 730 and 740 and a second thermally conducting plate 760 disposed on a second side of the semiconductors 730 and 740. A first insulators 770 may be disposed between the first thermally conducting plate 750 and the cooling plate 710 and a second insulator 780 may be disposed between the second thermally conducting plate 760 and the heating plate 720). A voltage may be provided to the two semiconductors 730 and 740, and DC current may flow across the semiconductors 730 and 740, causing a temperature difference. A region of the thermoelectric element 700 that is adjacent to the cooling plate 710 may absorb heat, and the heat may then be transferred to a region of the thermoelectric element 700 that is adjacent to the heating plate 720.

A current is provided to the heating plate 720, the current may flow along the p-type semiconductor 730 and the n-type semiconductor 740. The heating plate 720 may dissipate heat. In contrast, the cooling plate 710 may absorb heat. A voltage may be provided to the thermoelectric element 700 to provide a current to the thermoelectric element 700, thereby performing a Peltier effect operation, and the thermoelectric element 700 may be a Peltier cooler. The voltage may be provided to the thermoelectric element 700 through an arbitrary terminal. For example, the current provided to the heating plate 720 by the voltage may sequentially flow along the semiconductors 730 and 740 and may finally flow outside the thermoelectric element 700 through the heating plate 720. As the current flows, heat may be dissipated from the heating plate 720 and absorbed in the cooling plate 710 due to the Peltier effect. While FIG. 6 shows a thermoelectric element that includes two semiconductors, embodiments of the inventive concept are not necessarily limited thereto, and current flow through the thermoelectric element 700 may change according to structures and/or materials of the thermoelectric element 700.

FIG. 7 shows an operating voltage provided to the thermoelectric element 700 and an associated cooling performance.

Referring to FIG. 7, in an embodiment, an operating voltage having a voltage level between a first voltage level V1 and a second voltage level V2 may be provided to the thermoelectric element 700, causing the cooling performance of the thermoelectric element 700 to increase, and as the cooling performance of the thermoelectric element 700 increases, the operating temperature of a device in which the thermoelectric element 700 is disposed may decrease. In other words, the cooling performance of the thermoelectric element 700 may be proportional to the voltage level of the operating voltage provided to the thermoelectric element 700.

However, in a comparative example, when an operating voltage having a voltage level higher than the second voltage level V2 is provided to the thermoelectric element 700, the cooling performance of the thermoelectric element 700 may decrease as the voltage level of the operating voltage increases, and thus the temperature around the thermoelectric element 700 may increase.

Therefore, in contrast to the comparative example, the thermoelectric element 700 may be controlled such that an operating voltage having a voltage level between the first voltage level V1 and the second voltage level V2 is provided to the thermoelectric element 700.

Figure 8:
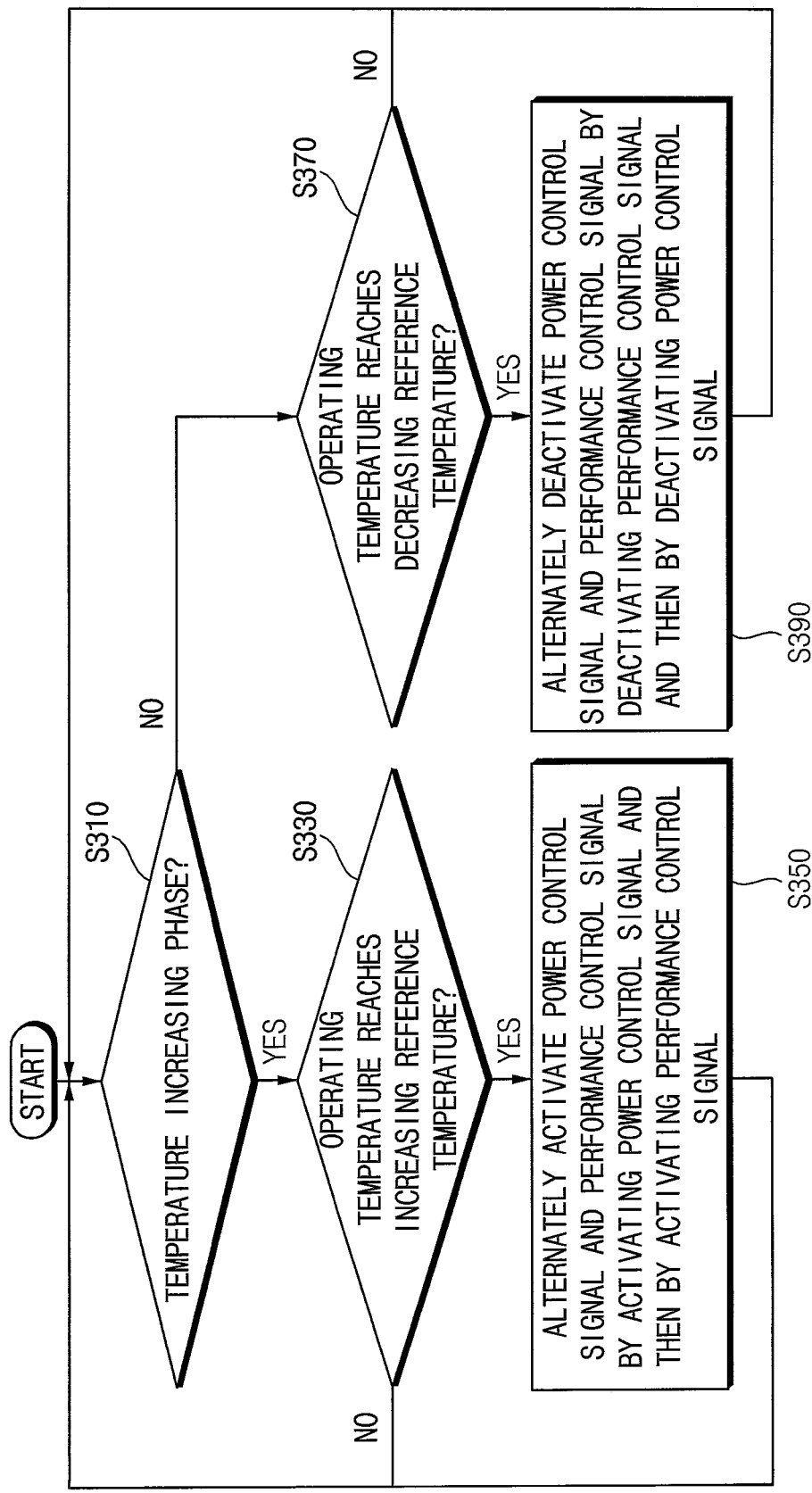
FIG. 8 is a flowchart of an operation of alternately activating or deactivating at least one power control signal of a plurality of power control signals and at least one performance control signal of a plurality of performance control signals of FIG. 1.

FIG. 8 is a flowchart of the operation of alternately activating or deactivating at least one power control signal of the plurality of power control signals and at least one performance control signal of the plurality of performance control signals of FIG. 1.

Referring to FIGS. 1 and 8, when alternately activating or deactivating the at least one power control signal and the at least one performance control signal (step S300), it may be determined based on the temperature information whether the storage device is operating in a temperature increasing phase or a temperature decreasing phase (step S310). For example, the temperature information may be periodically received, and an operating temperature of the storage device 300 included in the temperature information may be compared with a previous operating temperature that was included in a previously received temperature information. When the operating temperature is higher than the previous operating temperature, it may be determined that the storage device is operating in the temperature increasing phase. When the operating temperature is lower than the previous operating temperature, it may be determined that the storage device is operating in the temperature decreasing phase. In an embodiment, S310 may be performed by the storage controller 310 and/or the TE controller 340.

The plurality of reference temperatures may include a plurality of increasing reference temperatures. When it is determined that the storage device is operating in the temperature increasing phase (step S310: YES), it may be determined based on the temperature information whether the operating temperature equals an increasing reference temperature of the plurality of increasing reference temperatures (step S330). Each increasing reference temperature of the plurality of increasing reference temperatures may represent a condition for activating the at least one power control signal or the at least one performance control signal. In an embodiment, S330 may be performed by the storage controller 310 and/or the TE controller 340.

When it is determined that the operating temperature reaches an increasing reference temperature of the plurality of increasing reference temperatures (step S330: YES), the at least one power control signal and the at least one performance control signal may be alternately activated (step S350). For example, step S350 may be performed by activating the at least one power control signal first and then by activating the at least one performance control signal later. In an embodiment, S350 may be performed by the storage controller 310 and/or the TE controller 340.

Figure 17:
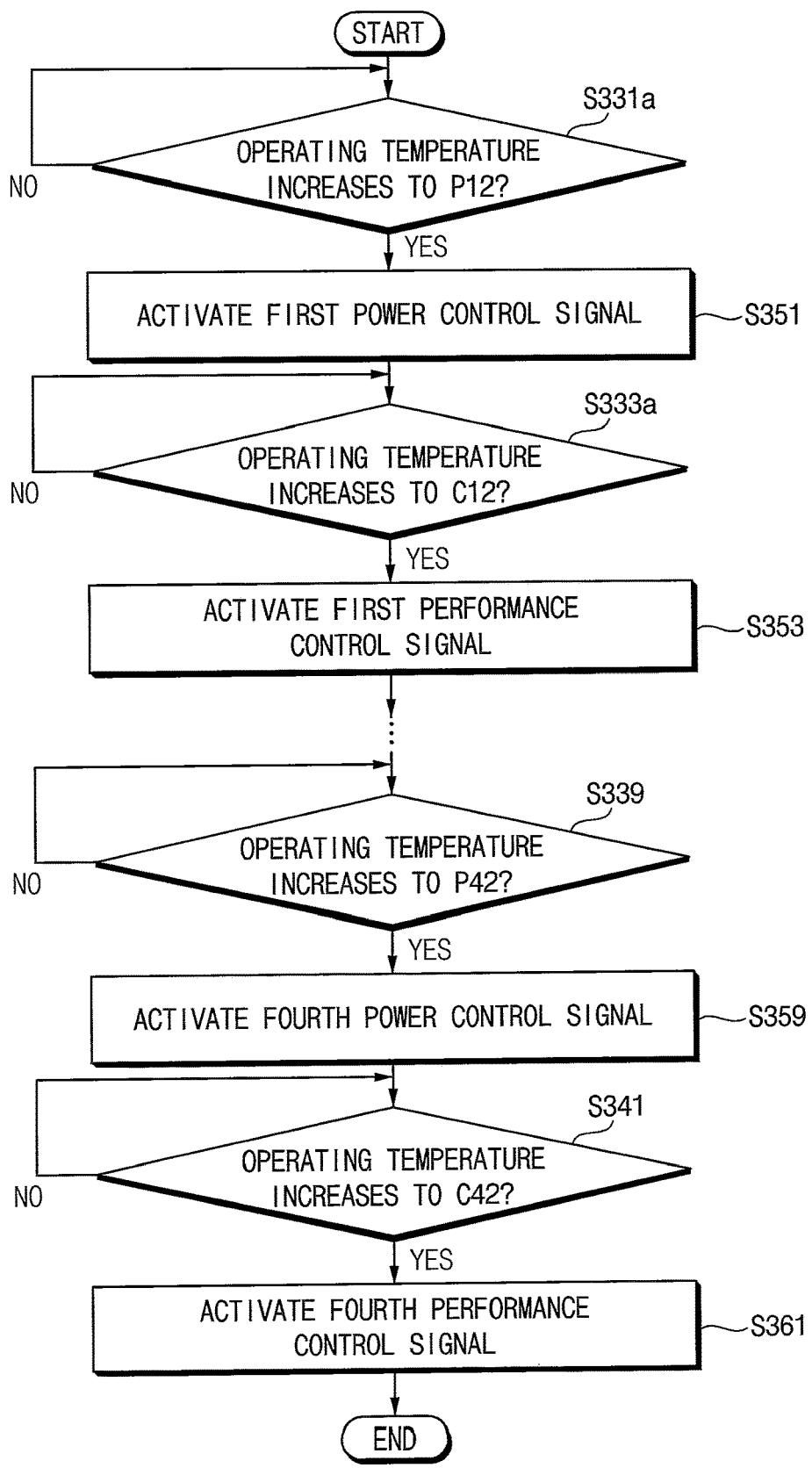
FIGS. 17 and 18 are flowcharts of the operation of alternately activating or deactivating at least one power control signal of the plurality of power control signals and at least one performance control signal of the plurality of performance control signals of FIG. 8 according to an embodiment of the inventive concept.

Steps S330 and S350 according to an embodiment of the inventive concept will be further described with reference to FIGS. 11 and 17.

The plurality of reference temperatures may include a plurality of decreasing reference temperatures. When it is determined that the storage device is operating in the temperature decreasing phase (step S310: NO), it may be determined based on the temperature information whether the operating temperature reaches a decreasing reference temperature of the plurality of decreasing reference temperatures (step S370). Each decreasing reference temperature of the plurality of decreasing reference temperatures may represent a condition for deactivating the at least one power control signal or the at least one performance control signal. In an embodiment, at least some decreasing reference temperatures of the plurality of decreasing reference temperatures may be substantially equal to at least some increasing reference temperatures of the plurality of increasing reference temperatures. In an embodiment, S370 may be performed by the storage controller 310 and/or the TE controller 340.

When it is determined that the operating temperature reaches one of the plurality of decreasing reference temperatures (step S370: YES), the at least one power control signal and the at least one performance control signal may be alternately deactivated (step S390). For example, step S390 may be performed by deactivating the at least one performance control signal first and then by deactivating the at least one power control signal later. In other words, an order of the deactivation of the signals performed during step S390 may be a reversal of an order of the activation of the signals performed during step S350. In an embodiment, S390 may be performed by the storage controller 310 and/or the TE controller 340.

Figure 18:
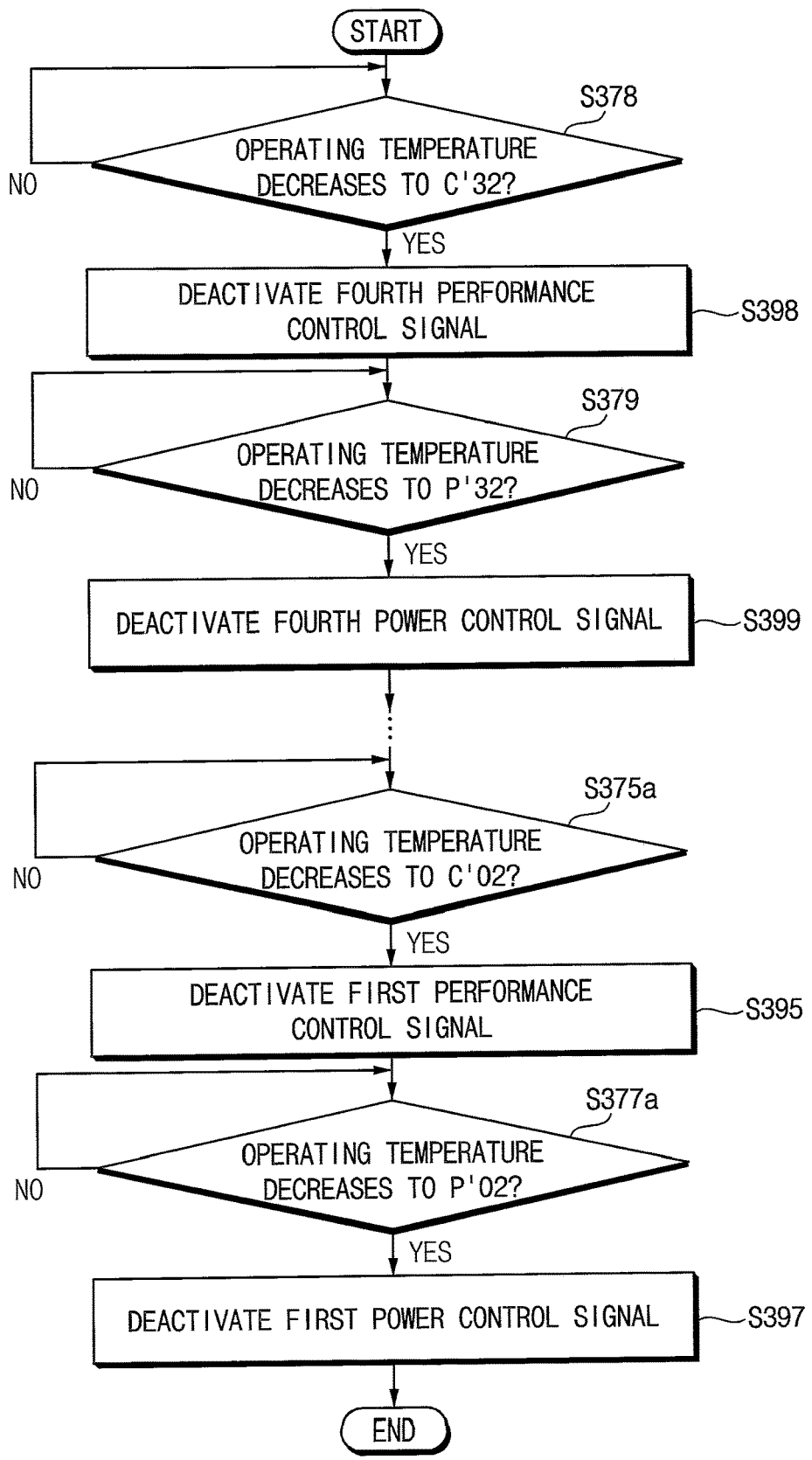

Steps S370 and S390 according to an embodiment of the inventive concept will be further described with reference to FIGS. 12 and 18.

When it is determined that the operating temperature does not reach the plurality of increasing reference temperatures or the plurality of decreasing reference temperatures (step S330: NO or step S370: NO), steps S310, S330 and S370 may be repeatedly performed.

Figure 9:
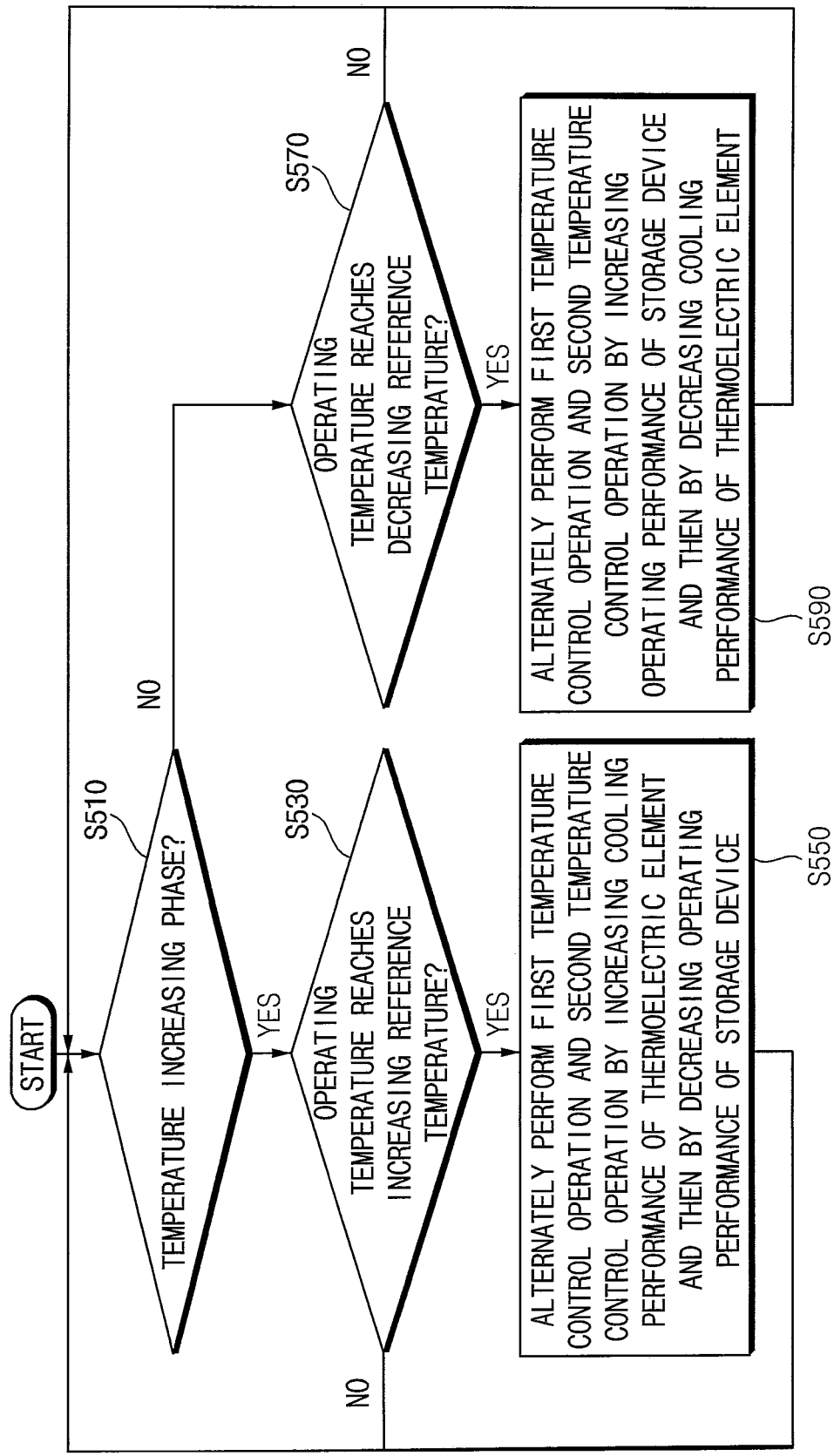
FIG. 9 is a flowchart of an operation of alternately performing a first temperature control operation and a second temperature control operation of FIG. 1.

FIG. 9 is a flowchart of an operation of alternately performing the first temperature control operation and the second temperature control operation of FIG. 1. Repeated description of operations and elements described with reference to FIG. 8 will be omitted.

Referring to FIGS. 1, 8, and 9, when alternately performing the first temperature control operation and the second temperature control operation (step S500), steps S510, S530, and S570 may be substantially the same as steps S310, S330, and S370 of FIG. 8, respectively. When steps S310, S330, and S370 of FIG. 8 are performed during step S300, steps S510, S530, and S570 may be omitted.

When it is determined that the operating temperature reaches an increasing reference temperature of the plurality of increasing reference temperatures (step S530: YES), the first temperature control operation for increasing the cooling performance of the thermoelectric element and the second temperature control operation for decreasing the operating performance of the storage device may be alternately performed based on the power control signal and the performance control signal that are activated during step S350 (step S550). For example, step S550 may be performed by increasing the cooling performance of the thermoelectric element first and then by decreasing the operating performance of the storage device later. In an embodiment, S550 may be performed by the storage controller 310 and/or the TE controller 340.

When it is determined that the operating temperature reaches a decreasing reference temperature of the plurality of decreasing reference temperatures (step S570: YES), the first temperature control operation, performed by decreasing the cooling performance of the thermoelectric element, and the second temperature control operation, performed by increasing the operating performance of the storage device, may be alternately performed based on the power control signal and the performance control signal that are deactivated during step S390 (step S590). For example, step S590 may be performed by increasing the operating performance of the storage device first and then by decreasing the cooling performance of the thermoelectric element later. In other words, an order of the first and second temperature control operations performed by step S590 may be a reversal of an order of the first and second temperature control operations performed by step S550. In an embodiment, S590 may be performed by the storage controller 310 and/or the TE controller 340.

Figure 19:
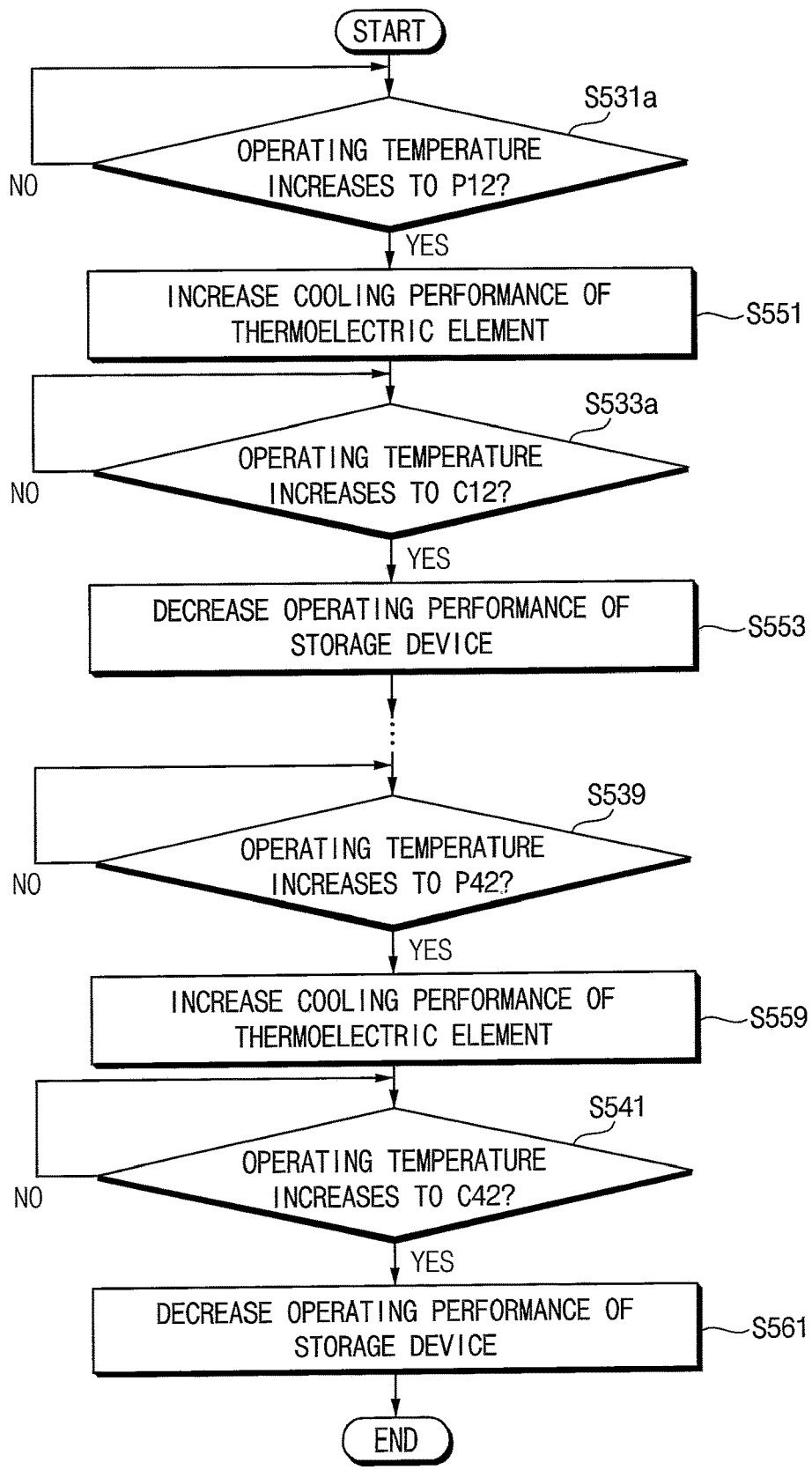
FIGS. 19 and 20 are flowcharts of the operation of alternately performing a first temperature control operation and a second temperature control operation of FIG. 9 according to an embodiment of the inventive concept.
Figure 20:
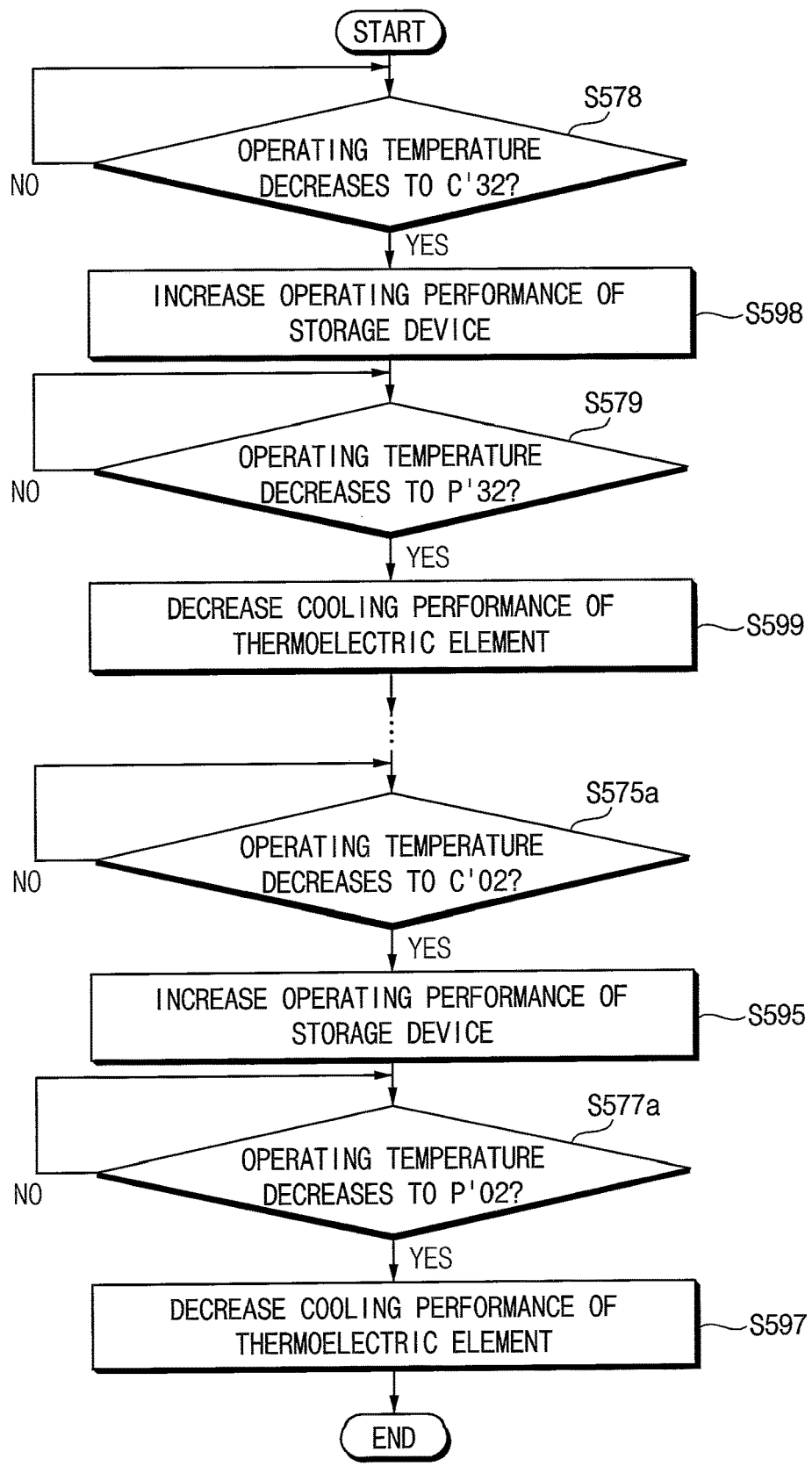

Steps S530 and S550 according to an embodiment of the inventive concept will be further described with reference to FIGS. 13 and 19, and steps S570 and S590 according to an embodiment of the inventive concept will be further described with reference to FIGS. 14 and 20.

Figure 10:
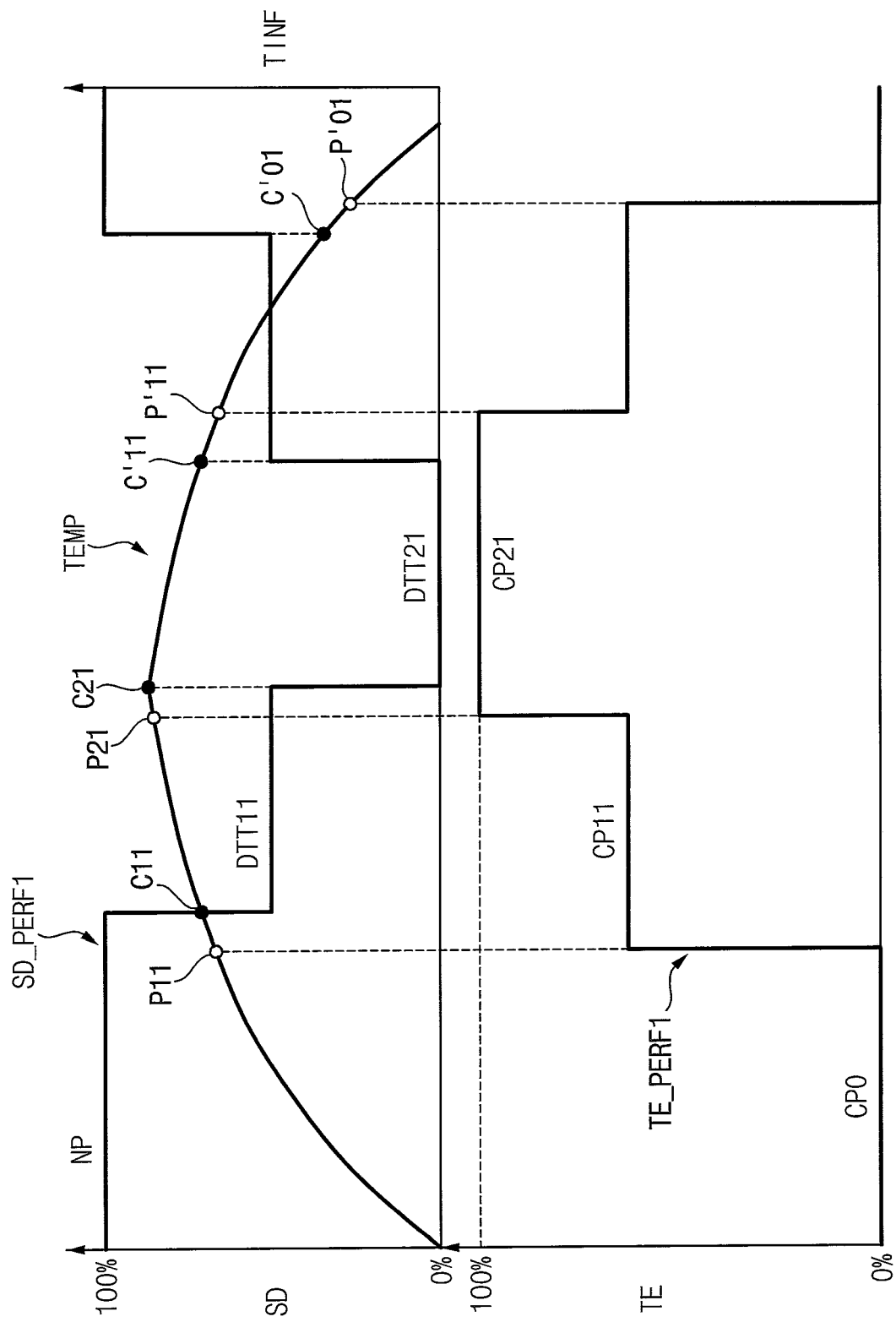
FIG. 10 is a diagram illustrating an operation of a storage device according to an embodiment of the inventive concept.

FIG. 10 is a diagram illustrating an operation of a storage device according to an embodiment of the inventive concept. FIGS. 11 and 12 are flowcharts of the operation of alternately activating or deactivating at least one power control signal of the plurality of power control signals and at least one performance control signal of the plurality of performance control signals of FIG. 8 according to an embodiment of the inventive concept. FIGS. 13 and 14 are flowcharts of the operation of alternately performing the first temperature control operation and the second temperature control operation of FIG. 9 according to an embodiment of the inventive concept. The operations of FIGS. 11, 12, 13, and 14 may be performed based on the operations of FIG. 10.

FIG. 10 shows temperature information TINF, a change in the operating temperature included in the temperature information over time TEMP, a storage device SD, a change in the operating performance of the storage device SD depending on the change in the operating temperature over time SD_PERF1, a thermoelectric element TE, and a change in the cooling performance of the thermoelectric element depending on the change in the operating temperature over time TE_PERF1.

FIG. 10 illustrates an embodiment in which a two-step first temperature control operation (e.g., a two-step cooling performance control operation) and a two-step second temperature control operation (e.g., a two-step performance throttling operation) are alternately performed. In FIG. 10, the operating performance SD_PERF1 of the storage device SD (e.g., the storage device 300) and the cooling performance TE_PERF1 of the thermoelectric element TE may be changed in steps (e.g., scalariformly) from between about 0% to about 100%.

Figure 11:
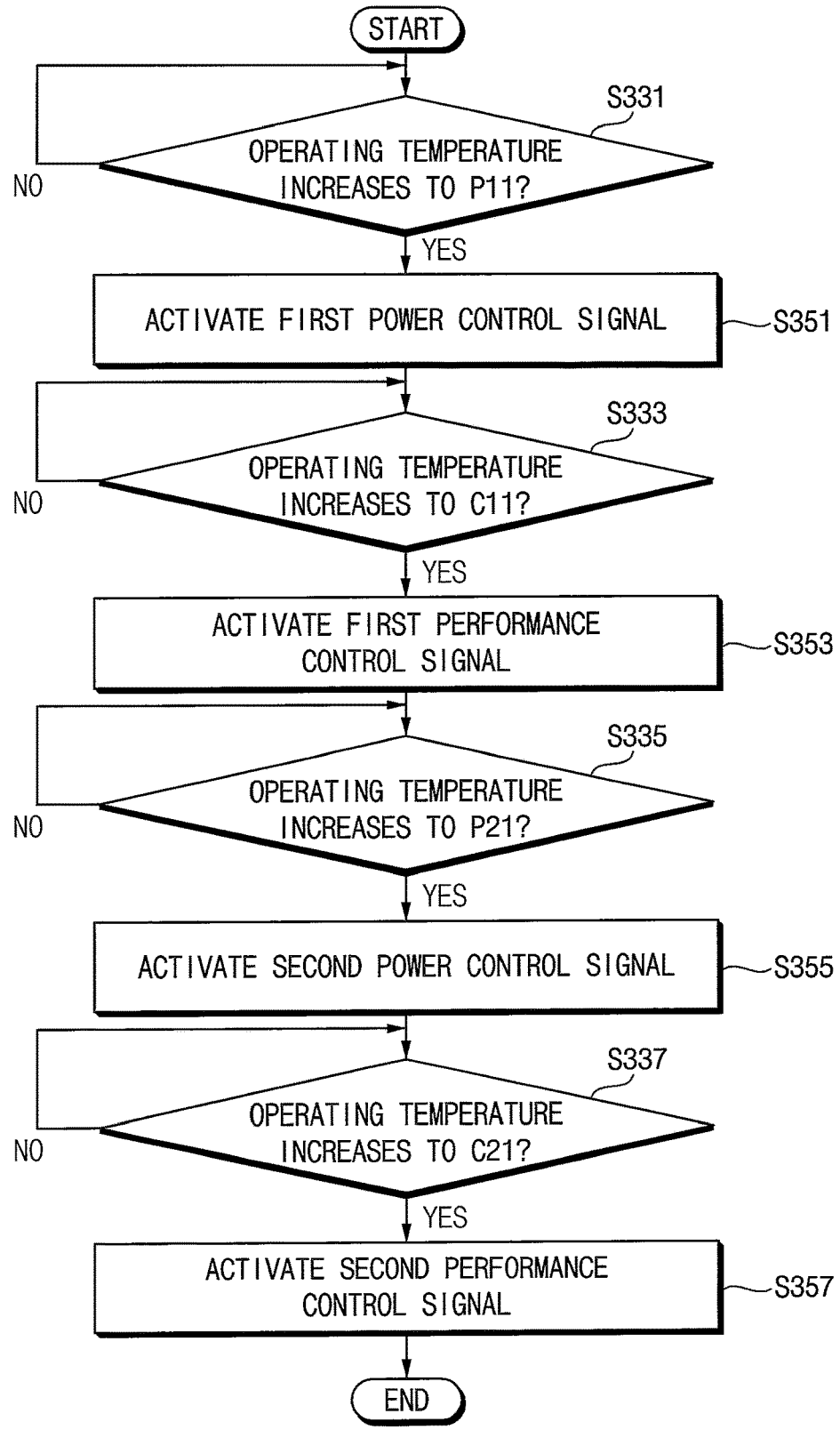
FIGS. 11 and 12 are flowcharts of the operation of alternately activating or deactivating at least one power control signal of the plurality of power control signals and at least one performance control signal of the plurality of performance control signals of FIG. 8 according to an embodiment of the inventive concept.

Referring to FIGS. 8, 10, and 11, when the storage device SD is operating or is driven, the operating temperature of the storage device SD may increase.

During step S330, it may be determined based on the temperature information TINF whether the operating temperature of the storage device SD increases or rises to a first temperature P11 (e.g., a first increasing reference temperature of the plurality of reference temperatures) (step S331). In an embodiment, step S331 may be performed by the storage controller 310 and/or the TE controller 340. When it is determined that the operating temperature of the storage device SD does not increase to the first temperature P11 (step S331: NO), the temperature information TINF may be checked continuously (by, e.g., the storage controller 310 and/or the TE controller 340) without additional operation. When the operating temperature of the storage device SD continues to increase and when it is determined that the operating temperature of the storage device SD increases to the first temperature P11 (step S331: YES), during step S350, a first power control signal of the plurality of power control signals may be activated (step S351). In an embodiment, step S351 may be performed by the TE controller 340.

After the operating temperature of the storage device SD increases to the first temperature P11, during step S330, it may be determined based on the temperature information TINF whether the operating temperature of the storage device SD increases to a second temperature C11 (e.g., a second increasing reference temperature of the plurality of reference temperatures) that is higher than the first temperature P11 (step S333). In an embodiment, step S333 may be performed by the storage controller 310 and/or the TE controller 340. When it is determined that the operating temperature of the storage device SD does not increase to the second temperature C11 (step S333: NO), the temperature information TINF may be checked continuously (by, e.g., the storage controller 310 and/or the TE controller 340) without additional operation. When the operating temperature of the storage device SD continues to increase and when it is determined that the operating temperature of the storage device SD increases to the second temperature C11 (step S333: YES), during step S350, a first performance control signal of the plurality of performance control signals may be activated (step S353). In an embodiment, step S351 may be performed by the storage controller 310.

After the operating temperature of the storage device SD increases to the second temperature C11, during step S330, it may be determined based on the temperature information TINF whether the operating temperature of the storage device SD increases to a third temperature P21 (e.g., a third increasing reference temperature of the plurality of reference temperatures) that is higher than the second temperature C11 (step S335). In an embodiment, step S335 may be performed by the storage controller 310 and/or the TE controller 340. When it is determined that the operating temperature of the storage device SD does not increase to the third temperature P21 (step S335: NO), the temperature information TINF may be checked continuously (by, e.g., the storage controller 310 and/or the TE controller 340) without additional operation. When the operating temperature of the storage device SD continues to increase and when it is determined that the operating temperature of the storage device SD increases to the third temperature P21 (step S335: YES), during step S350, a second power control signal of the plurality of power control signals may be activated (step S355). In an embodiment, step S355 may be performed by the TE controller 340.

After the operating temperature of the storage device SD increases to the third temperature P21, during step S330, it may be determined based on the temperature information TINF whether the operating temperature of the storage device SD increases to a fourth temperature C21 (e.g., a fourth increasing reference temperature of the plurality of reference temperatures) that is higher than the third temperature P21 (step S337). In an embodiment, step S337 may be performed by the storage controller 310 and/or the TE controller 340. When it is determined that the operating temperature of the storage device SD does not increase to the fourth temperature C21 (step S337: NO), the temperature information TINF may be checked continuously (by, e.g., the storage controller 310 and/or the TE controller 340) without additional operation. When the operating temperature of the storage device SD continues to increase and when it is determined that the operating temperature of the storage device SD increases to the fourth temperature C21 (step S337: YES), during step S350, a second performance control signal of the plurality of performance control signals may be activated (step S357). In an embodiment, step S357 may be performed by the storage controller 310.

In an embodiment, if the temperature phase of the storage device SD is changed from the temperature increasing phase to the temperature decreasing phase after performing a step shown by FIG. 11 (e.g., step S353), subsequent steps shown by FIG. 11 (e.g., steps S335, S355, S337 and S357) may not be performed.

Figure 12:
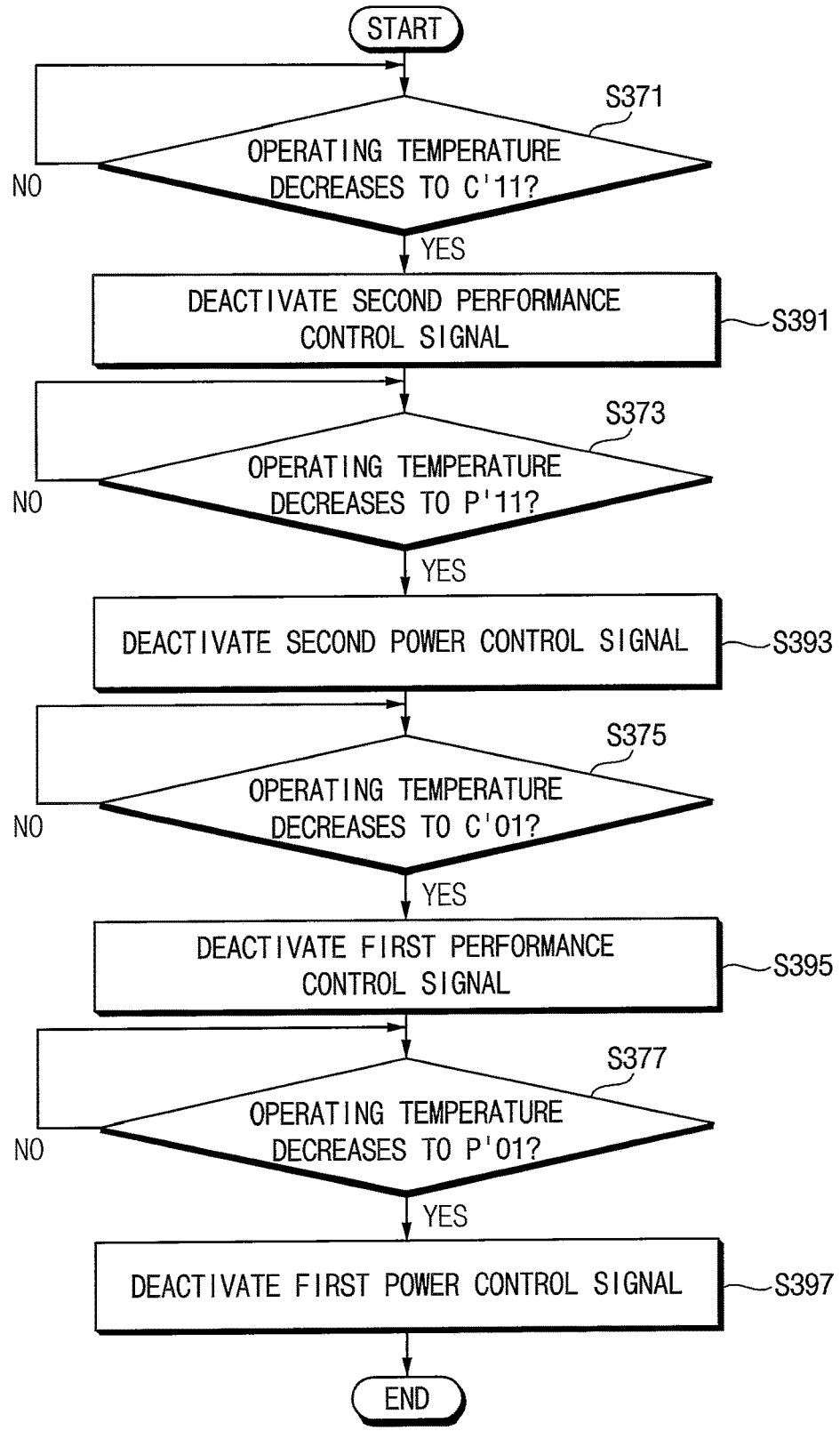

Referring to FIGS. 8, 10, and 12, when the temperature control operation is performed, the operating temperature of the storage device SD may decrease.

After the operating temperature of the storage device SD increases to the fourth temperature C21, during step S370, it may be determined based on the temperature information TINF whether the operating temperature of the storage device SD decreases or falls to a fifth temperature C'11 (e.g., a first decreasing reference temperature of the plurality of decreasing reference temperatures) that is lower than the fourth temperature C21 (step S371). In an embodiment, step S371 may be performed by the storage controller 310 and/or the TE controller 340. For example, the fifth temperature C'11 may be substantially equal to the second temperature C11; however, the fifth temperature C'11 may alternatively be different from the second temperature C11. When it is determined that the operating temperature of the storage device SD does not decrease to the fifth temperature C'11 (step S371: NO), the temperature information TINF may be checked continuously (by, e.g., the storage controller 310 and/or the TE controller 340) without additional operation. When the operating temperature of the storage device SD continues to decrease and when it is determined that the operating temperature of the storage device SD decreases to the fifth temperature C'11 (step S371: YES), during step S390, the second performance control signal may be deactivated (step S391). In an embodiment, step S391 may be performed by the storage controller 310.

After the operating temperature of the storage device SD decreases to the fifth temperature C'11, during step S370, it may be determined based on the temperature information TINF whether the operating temperature of the storage device SD decreases to a sixth temperature P'11 (e.g., a second decreasing reference temperature of the plurality of decreasing reference temperatures) that is lower than the fifth temperature C'11 (step S373). In an embodiment, step S373 may be performed by the storage controller 310 and/or the TE controller 340. For example, the sixth temperature P'11 may be substantially equal to the first temperature P11; however, the sixth temperature P'11 may alternatively be different from the first temperature P11. When it is determined that the operating temperature of the storage device SD does not decrease to the sixth temperature P'11 (step S373: NO), the temperature information TINF may be checked continuously (by, e.g., the storage controller 310 and/or the TE controller 340) without additional operation. When the operating temperature of the storage device SD continues to decrease and when it is determined that the operating temperature of the storage device SD decreases to the sixth temperature P'11 (step S373: YES), during step S390, the second power control signal may be deactivated (step S393). In an embodiment, step S391 may be performed by the TE controller 340.

After the operating temperature of the storage device SD decreases to the sixth temperature P'11, during step S370, it may be determined based on the temperature information TINF whether the operating temperature of the storage device SD decreases to a seventh temperature C'01 (e.g., a third decreasing reference temperature of the plurality of decreasing reference temperatures) that is lower than the sixth temperature P'11 (step S375). In an embodiment, step S375 may be performed by the storage controller 310 and/or the TE controller 340. When it is determined that the operating temperature of the storage device SD does not decrease to the seventh temperature C'01 (step S375: NO), the temperature information TINE may be checked continuously (by, e.g., the storage controller 310 and/or the TE controller 340) without additional operation. When the operating temperature of the storage device SD continues to decrease and when it is determined that the operating temperature of the storage device SD decreases to the seventh temperature C'01 (step S375: YES), during step S390, the first performance control signal may be deactivated (step S395). In an embodiment, step S395 may be performed by the storage controller 310.

After the operating temperature of the storage device SD decreases to the seventh temperature C'01, during step S370, it may be determined based on the temperature information TINF whether the operating temperature of the storage device SD decreases to an eighth temperature P'01 (e.g., a fourth decreasing reference temperature of the plurality of decreasing reference temperatures) that is lower than the sixth temperature P'11 (step S377). In an embodiment, step S377 may be performed by the storage controller 310 and/or the TE controller 340. When it is determined that the operating temperature of the storage device SD does not decrease to the eighth temperature P'01 (step S377: NO), the temperature information TINF may be checked continuously (by, e.g., the storage controller 310 and/or the TE controller 340) without additional operation. When the operating temperature of the storage device SD continues to decrease and when it is determined that the operating temperature of the storage device SD decreases to the eighth temperature P'01 (step S377: YES), during step S390, the first power control signal may be deactivated (step S397). In an embodiment, step S397 may be performed by the TE controller 340.

In an embodiment, if the temperature phase of the storage device SD is changed from the temperature decreasing phase to the temperature increasing phase after performing a step shown by FIG. 12 (e.g., step S393), subsequent steps shown by FIG. 12 (e.g., steps S375, S395, S377, and S397) may not be performed.

Figure 13:
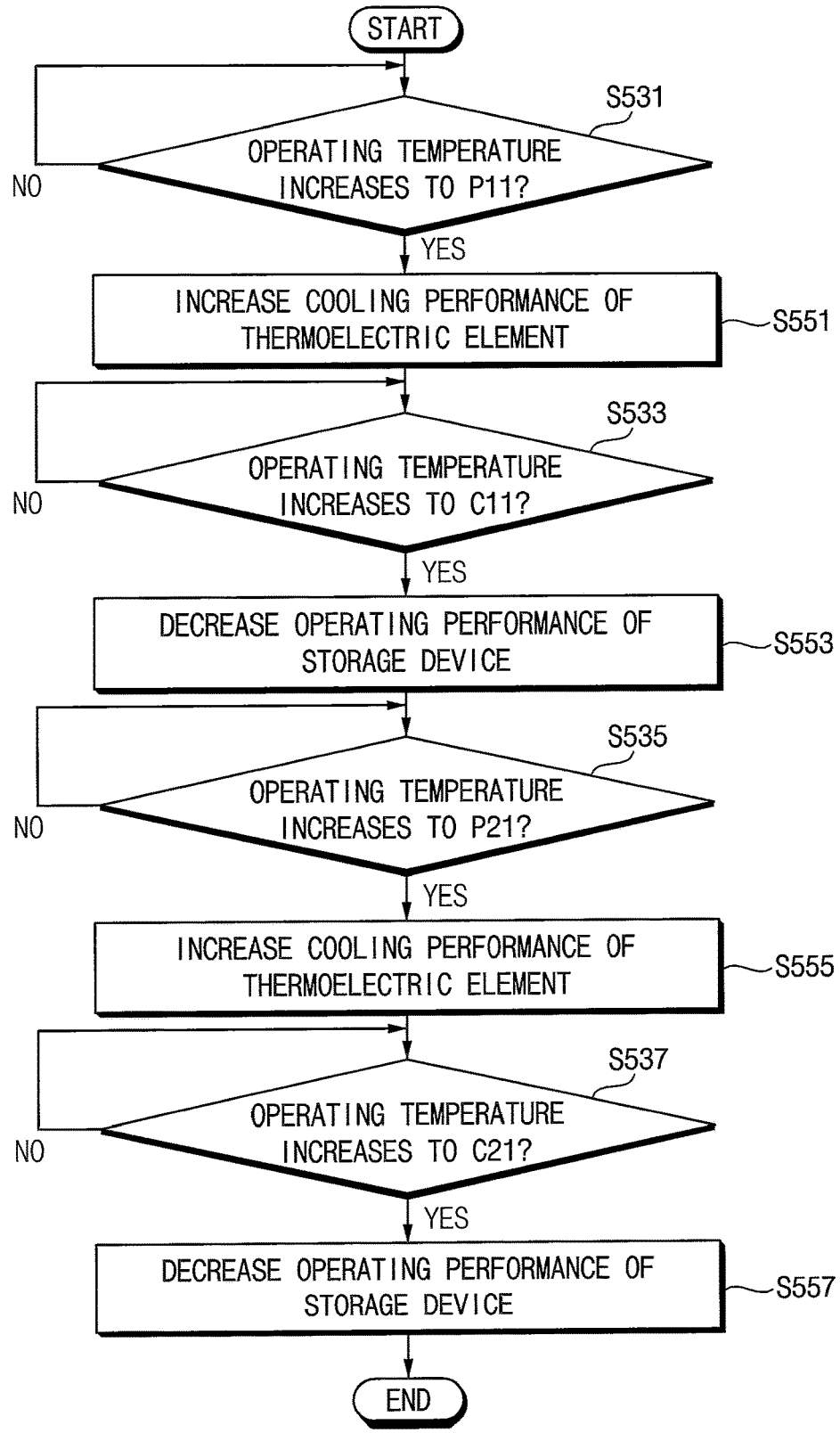
FIGS. 13 and 14 are flowcharts of the operation of alternately performing a first temperature control operation and a second temperature control operation of FIG. 9 according to an embodiment of the inventive concept.

Referring to FIGS. 9, 10, and 13, during an initial operating time, the storage device SD may operate with a first operating performance NP, and the thermoelectric element TE may not be driven and may operate with a first cooling performance CPO. For example, the first operating performance NP may represent an operating performance in a normal state of the storage device SD of about 100% operating performance, and the cooling performance CPO may represent cooling performance in a non-driving state of the thermoelectric element TE of about 0% cooling performance.

Steps S531, S533, S535, and S537 may be substantially the same as steps S331, S333, S335, and S337 in FIG. 11, respectively. When steps S331, S333, S335, and S337 in FIG. 11 are performed, steps S531, S533, S535, and S537 may be omitted. Repeated description of operations and elements described with respect to FIG. 11 will be omitted.

During step S530, when it is determined that the operating temperature of the storage device SD increases to the first temperature P11 (step S531: YES), during step S550, the thermoelectric element TE may be driven based on the activated first power control signal such that the thermoelectric element TE operates with a first cooling performance CP11 (step S551).

During step S530, when it is determined that the operating temperature of the storage device SD increases to the second temperature C11 (step S533: YES), during step S550, the operating performance of the storage device SD may be decreased from the first operating performance NP to a second operating performance DTT11 based on the activated first performance control signal (step S553).

In an embodiment, as described with reference to FIG. 5, the storage device SD may include a storage controller and a plurality of nonvolatile memories that are connected through a plurality of channels and a plurality of ways. When the storage device SD operates with the first operating performance NP, the plurality of channels and the plurality of ways may be enabled or activated. When the storage device SD operates with the second operating performance DTT11, only some channels of the plurality of channels and some ways of the plurality of ways may be enabled.

During step S530, when it is determined that the operating temperature of the storage device SD increases to the third temperature P21 (step S335: YES), during step S550, the thermoelectric element TE may be driven based on the activated second power control signal such that the thermoelectric element TE operates with a second cooling performance CP21 that is higher than the first cooling performance CP11 (step S555). For example, the second cooling performance CP21 may represent about a 100% cooling performance of the thermoelectric element TE.

In an embodiment, as described with reference to FIG. 7, when an operating voltage (e.g., power) of the thermoelectric element TE increases, the cooling performance of the thermoelectric element TE may increase. When the thermoelectric element TE operates with the first cooling performance CP11, the thermoelectric element TE may be driven based on the operating voltage having a first voltage level. When the thermoelectric element TE operates with the second cooling performance CP21, the thermoelectric element TE may be driven based on the operating voltage having a second voltage level higher than the first voltage level.

During step S530, when it is determined that the operating temperature of the storage device SD increases to the fourth temperature C21 (step SS37: YES), during step S550, the operating performance of the storage device SD may be decreased from the second operating performance DTT11 to a third operating performance DTT21 based on the activated second performance control signal (step S557). For example, the third operating performance DTT21 may represent an operating performance of a non-driving state, e.g., about a 0% operating performance of the storage device SD.

Figure 14:
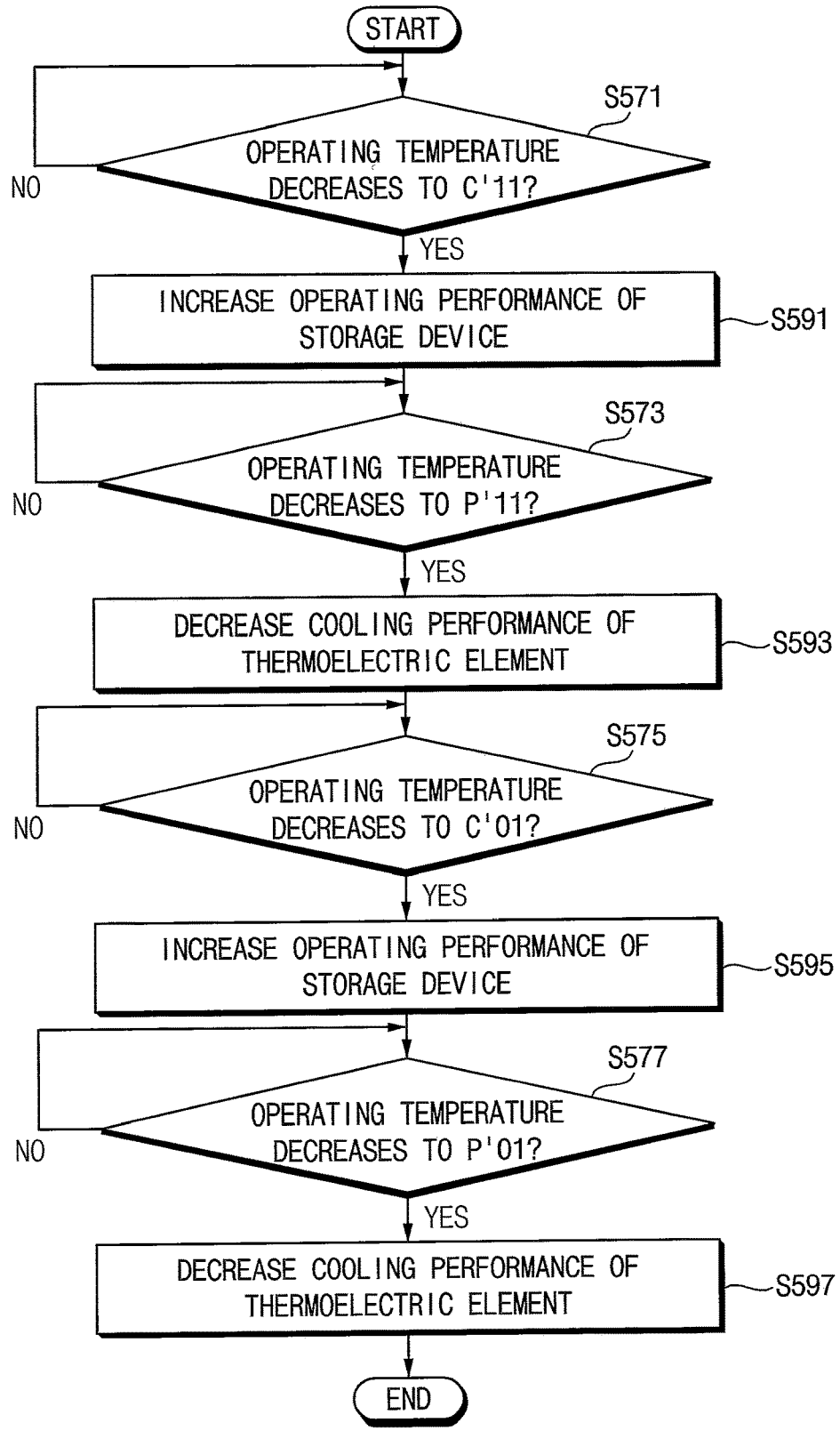

Referring to FIGS. 9, 10, and 14, steps S571, S573, S575, and S577 may be substantially the same as steps S371, S373, S375, and S377 in FIG. 12, respectively. When steps S371, S373, S375, and S377 in FIG. 12 are performed, steps S571, S573, S575, and S577 may be omitted. Repeated description of operations and elements described with reference to FIG. 12 will be omitted.

During step S570, when it is determined that the operating temperature of the storage device SD decreases to the fifth temperature C'11 (step S571: YES), during step S590, the operating performance of the storage device SD may be increased from the third operating performance DTIT21 to the second operating performance DTT11 based on the deactivated second performance control signal (step S591).

During step S570, when it is determined that the operating temperature of the storage device SD decreases to the sixth temperature P'11 (step S573: YES), during step S590, the thermoelectric element TE may be driven based on the deactivated second power control signal such that the thermoelectric element TE operates with the first cooling performance CP11 that is lower than the second cooling performance CP21 (step S593).

During step S570, when it is determined that the operating temperature of the storage device SD decreases to the seventh temperature C'01 (step S575: YES), during step S590, the operating performance of the storage device SD may be increased from the second operating performance DTT11 to the first operating performance NP based on the deactivated first performance control signal (step S595).

During step S570, when it is determined that the operating temperature of the storage device SD decreases to the eighth temperature P'01 (step S577: YES), during step S590, the thermoelectric element TE may be driven based on the deactivated first power control signal such that the thermoelectric element TE operates with the cooling performance CPO (e.g., the thermoelectric element TE may not be driven) (step S597).

Figure 15:
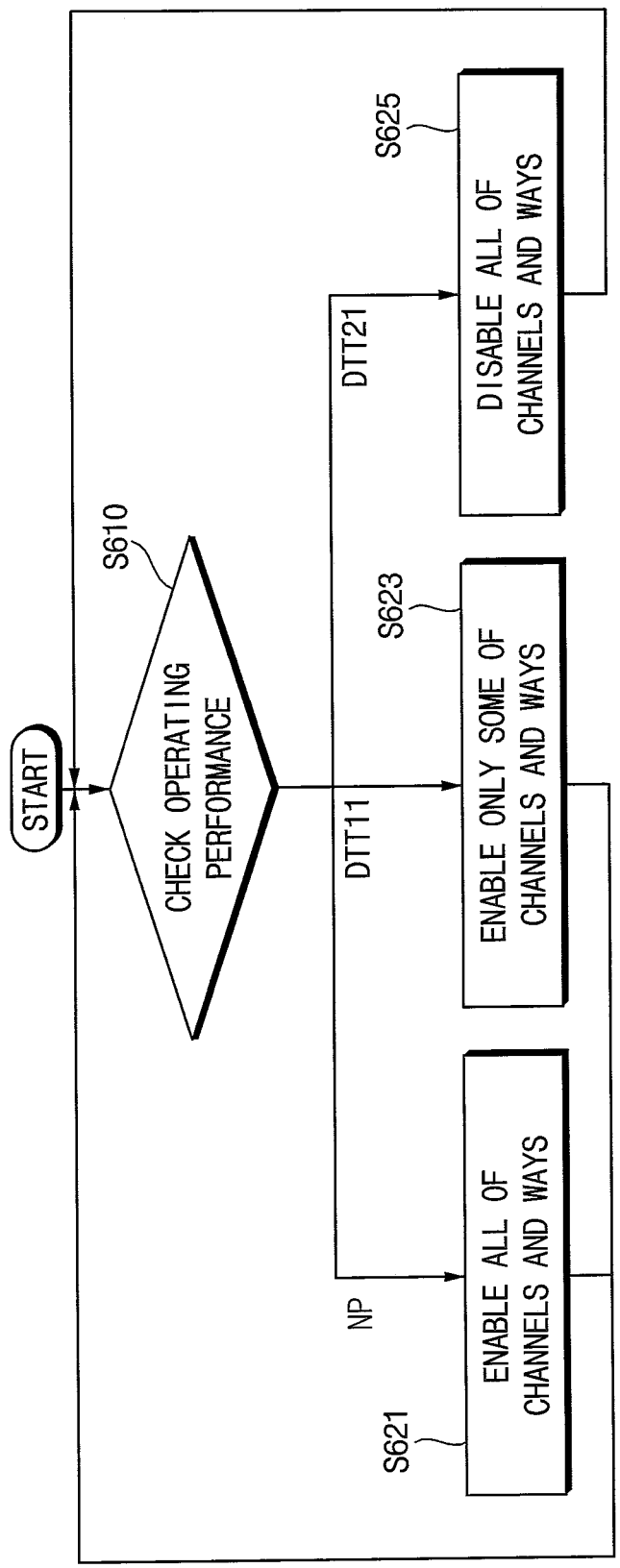
FIG. 15 is a flowchart of an operation of controlling an operating performance of a storage device of FIG. 10 according to an embodiment of the inventive concept.

FIG. 15 is a flowchart of an operation of controlling an operating performance of a storage device of FIG. 10.

Referring to FIGS. 10 and 15, the operating performance (or state) of the storage device SD that is set based on the temperature information TINF may be checked or determined (step S610). In an embodiment, S610 may be performed by the storage controller 310 and/or the TE controller 340.

When the storage device SD operates with the first operating performance NP (step S610: NP), the plurality of channels and the plurality of ways included in the storage device SD may be enabled (step S621). When the storage device SD operates with the second operating performance DTT11 (step S610: DTT11), only some channels of the plurality of channels and only some ways of the plurality of ways may be enabled (step S623). In an embodiment, S623 may be performed by the storage controller 310. When the storage device SD operates with the third operating performance DTT21 (step S610: DTT21), the plurality of channels and the plurality of ways may be disabled (step S625). In an embodiment, S623 may be performed by the storage controller 310. For example, when the storage device SD includes eight channels and eight ways, the number of channels and ways enabled during steps S621, S623, and S625 may be 8, 4 and 0, respectively.

Figure 16:
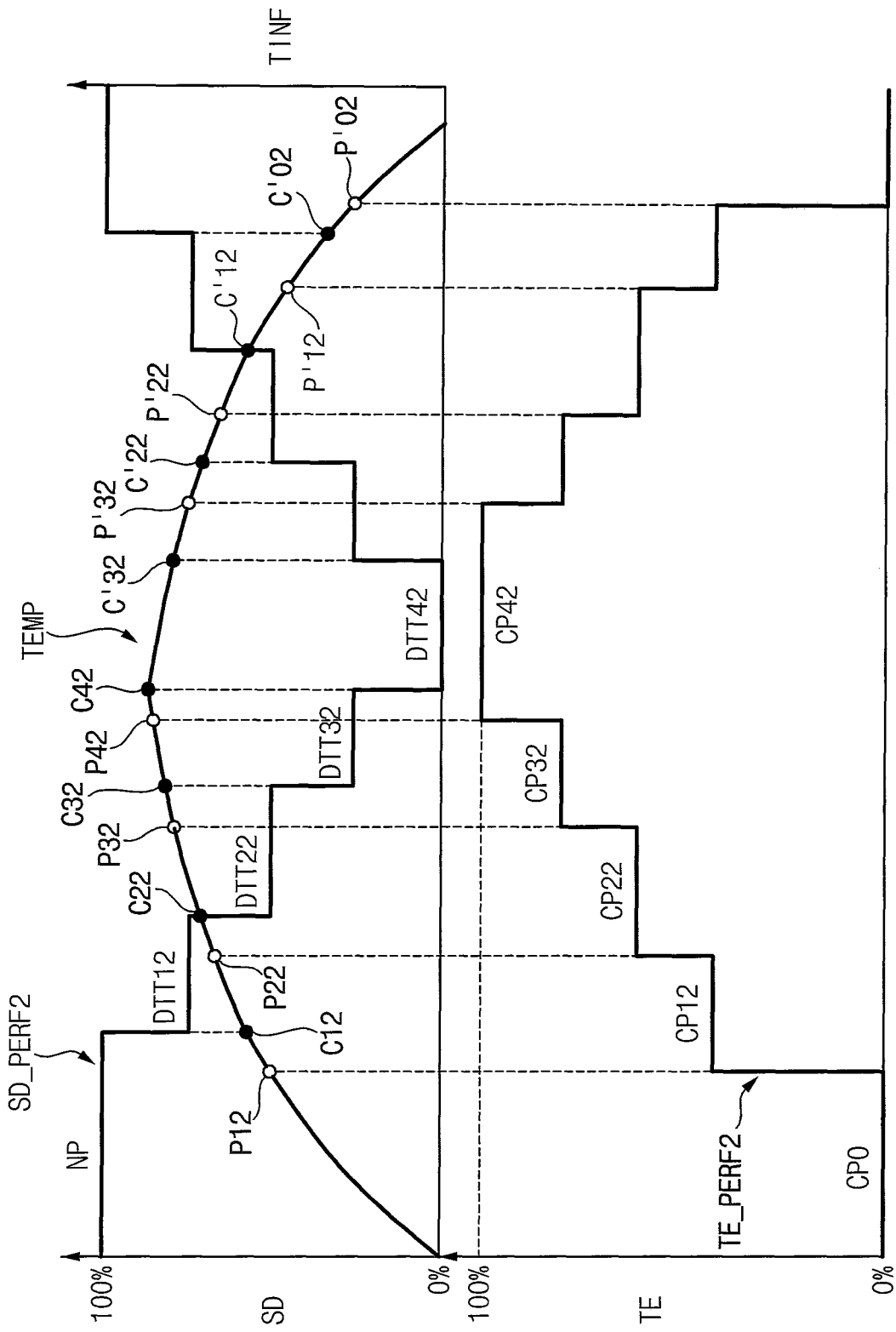
FIG. 16 is a diagram illustrating an operation of a storage device according to an embodiment of the inventive concept.

FIG. 16 is a diagram illustrating an operation of a storage device according to an embodiment of the inventive concept. FIGS. 17 and 18 are flowcharts of the operation of alternately activating or deactivating at least one power control signal and at least one performance control signal of FIG. 8 according to an embodiment of the inventive concept. FIGS. 19 and 20 are flowcharts of the operation of alternately performing a first temperature control operation and a second temperature control operation of FIG. 9 according to an embodiment of the inventive concept. The operations of FIGS. 17, 18, 19, and 20 may be performed based on the operation of FIG. 16. Repeated description of operations and elements described with reference to FIGS. 10, 11, 12, 13, and 14 will be omitted.

FIG. 16 illustrates an embodiment in which a four-step first temperature control operation (e.g., a four-step cooling performance control operation) and a four-step second temperature control operation (e.g., a four-step performance throttling operation) are alternately performed. In FIG. 16, the operating performance SD_PERF2 of the storage device SD and the cooling performance TE_PERF2 of the thermoelectric element TE may be changed in steps (e.g., scalariformly) from between about 0% to about 100%.

Referring to FIGS. 8, 16, 17 and 19, during steps S330 and S530, when the operating temperature of the storage device SD increases to the first temperature P12 (step S331a: YES and S531a: YES), during step S350, a first power control signal may be activated (step S351), and during step S550, the thermoelectric element TE may be driven to have the first cooling performance CP12 (step S551).

During steps S330 and SS30, when the operating temperature of the storage device SD increases to a second temperature C12 (step S333a: YES and S533a: YES), during step S350, a first performance control signal may be activated (step S353), and during step S550, the operating performance of the storage device SD may be decreased from the first operating performance NP to a second operating performance DTT12 (step S553).

Subsequently, when the operating temperature of the storage device SD increases to a third temperature P22, a second power control signal may be activated, and the thermoelectric element TE may be driven to operate with a second cooling performance CP22 that is higher than the first cooling performance CP12. When the operating temperature of the storage device SD increases to a fourth temperature C22, a second performance control signal may be activated, and the operating performance of the storage device SD may be decreased from the second operating performance DTT12 to a third operating performance DTT22. When the operating temperature of the storage device SD increases to the fifth temperature P32, a third power control signal may be activated, and the thermoelectric element TE may be driven to operate with a third cooling performance CP32 that is higher than the second cooling performance CP22. When the operating temperature of the storage device SD increases to a sixth temperature C32, a third performance control signal may be activated, and the operating performance of the storage device SD may be decreased from the third operating performance DTT22 to a fourth operating performance DTT32.

Subsequently, when the operating temperature of the storage device SD increases to a seventh temperature P42 (step S339: YES and S539: YES), a fourth power control signal may be activated (step S359), and the thermoelectric element TE may be driven to operate with a fourth cooling performance CP42 that is higher than the third cooling performance CP32 (step S559). When the operating temperature of the storage device SD increases to an eighth temperature C42 (step S341: YES and S541: YES), a fourth performance control signal may be activated (step S361), and the operating performance of the storage device SD may be decreased from the fourth operating performance DTT32 to a fifth operating performance DTT42 (step S561).

Referring to FIGS. 9, 16, 18, and 20, during steps S370 and S570, when the operating temperature of the storage device SD decreases to a ninth temperature C'32 (step S378: YES and S578: YES), during step S390, the fourth performance control signal may be deactivated (step S398), and during step S590, the operating performance of the storage device SD may be increased from the fifth operating performance DTT42 to the fourth operation performance DTT32 (step S598).

During steps S370 and S570, when the operating temperature of the storage device SD decreases to a tenth temperature P'32 (step S379: YES and S579: YES), the fourth power control signal may be deactivated (step S399), and the thermoelectric element TE may be driven to operate with the third cooling performance CP32 that is lower than the fourth cooling performance CP42 (step S599).

Subsequently, when the operating temperature of the storage device SD decreases to an eleventh temperature C'22, the third performance control signal may be deactivated, and the operating performance of the storage device SD may be increased to the third operating performance DTT22. When the operating temperature of the storage device SD decreases to a twelfth temperature P'22, the third power control signal may be deactivated, and the thermoelectric element TE may be driven to operate with the second cooling performance CP22. When the operating temperature of the storage device SD decreases to a thirteenth temperature C'12, the second performance control signal may be deactivated, and the operating performance of the storage device SD may be increased to the second operating performance DTT12. When the operating temperature of the storage device SD decreases to the fourteenth temperature P'12, the second power control signal may be deactivated, and the thermoelectric element TE may be driven to operate with the first cooling performance CP12.

Subsequently, when the operating temperature of the storage device SD decreases to a fifteenth temperature C'02

(step S375a: YES and S575a: YES), the first performance control signal may be deactivated (step S395), and the operating performance of the storage device SD may be increased to the first operating performance NP (step S595). When the operating temperature of the storage device SD decreases to a sixteenth temperature P'02 (step S377a: YES and S577a: YES), the first power control signal may be deactivated (step S397), and the thermoelectric element TE may operate with the cooling performance CPO (e.g., the thermoelectric element TE may not be driven) (step S597).

Figure 21:
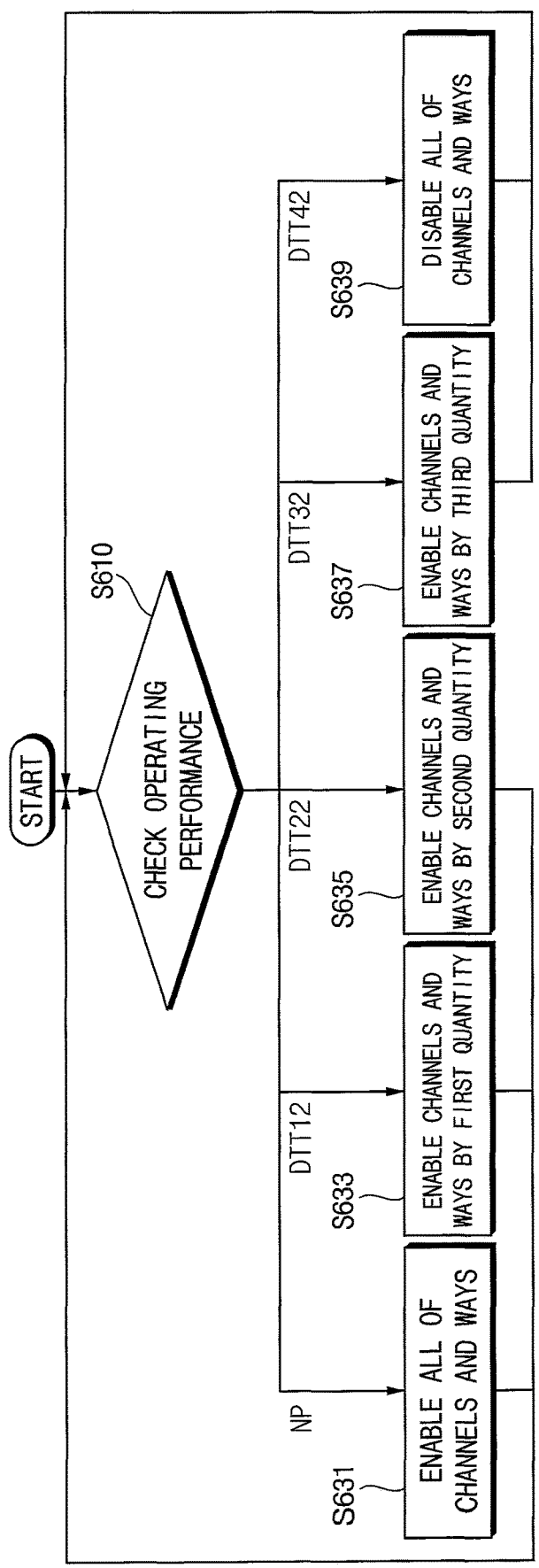
FIG. 21 is a flowchart of an operation of controlling the operating performance of the storage device of FIG. 16 according to an embodiment of the inventive concept.

FIG. 21 is a flowchart of an operation of controlling an operating performance of the storage device of FIG. 16 according to an embodiment of the inventive concept. Repeated description of operations and elements described with reference to FIG. 15 will be omitted.

Referring to FIGS. 16 and 21, steps S610, S631, and S639 may be substantially the same as steps S610, S621, and S625 of FIG. 15, respectively. Each of steps S633, S635, and S637 may be similar to steps S623 of FIG. 15. A first quantity (or a first number) in step S633 may be greater than a second quantity (or a second number) in step S635, and the second quantity may be greater than a third quantity (or a third number) in step S637. For example, when the storage device SD includes eight channels and eight ways, the number of channels and ways enabled in steps S631, S633, S635, S637, and S639 may be 8, 6, 4, 2, and 0, respectively.

Although the alternate performance of two-step first and second temperature control operations or four-step first and second temperature control operations have been described, embodiments of the inventive concept are not necessarily limited thereto. For example, in an embodiment of the inventive concept, k-step first and second temperature control operations may be alternately performed, where k is a natural number greater than or equal to two.

Figure 22A:
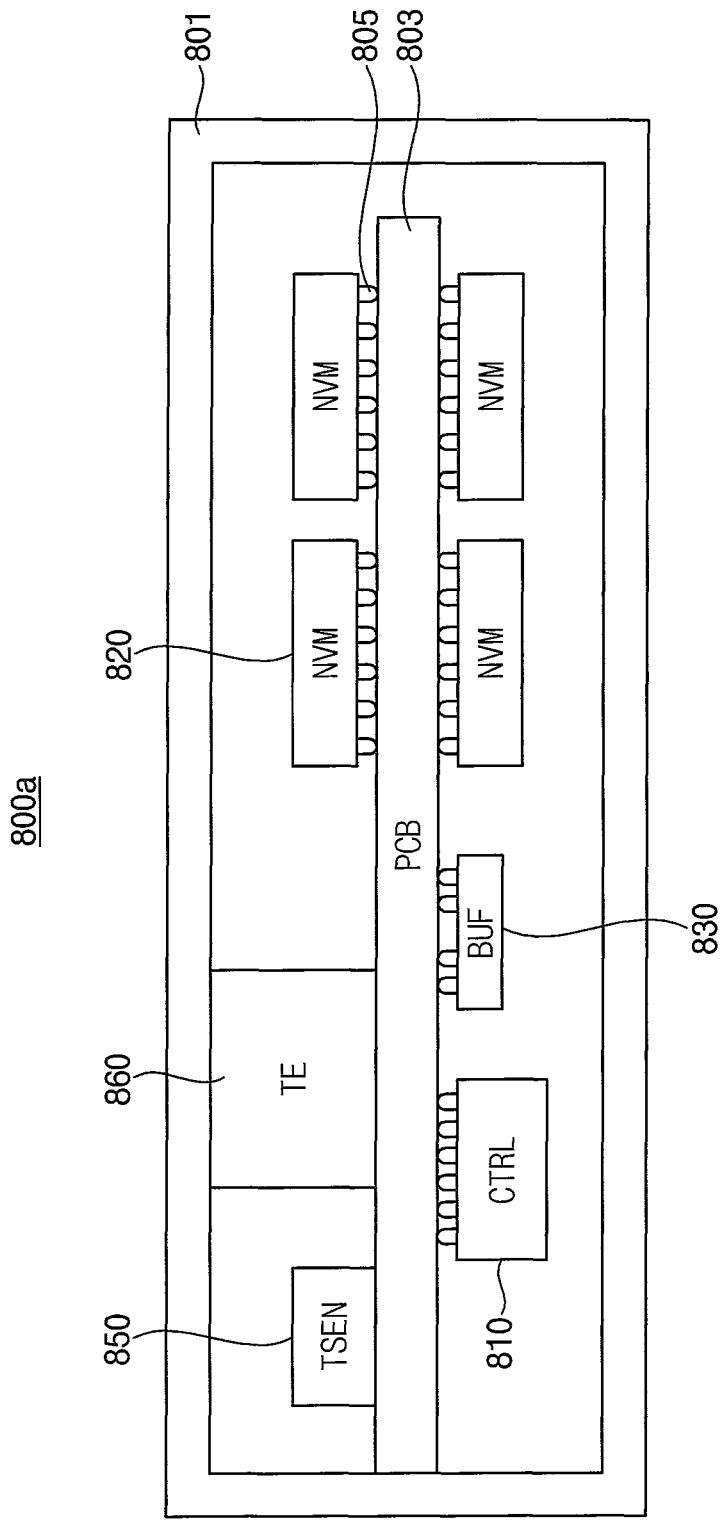
FIGS. 22A, 22B, and 22C are cross-sectional views illustrating an arrangement of a thermoelectric element included in a storage device according to an embodiment of the inventive concept.
Figure 22B:
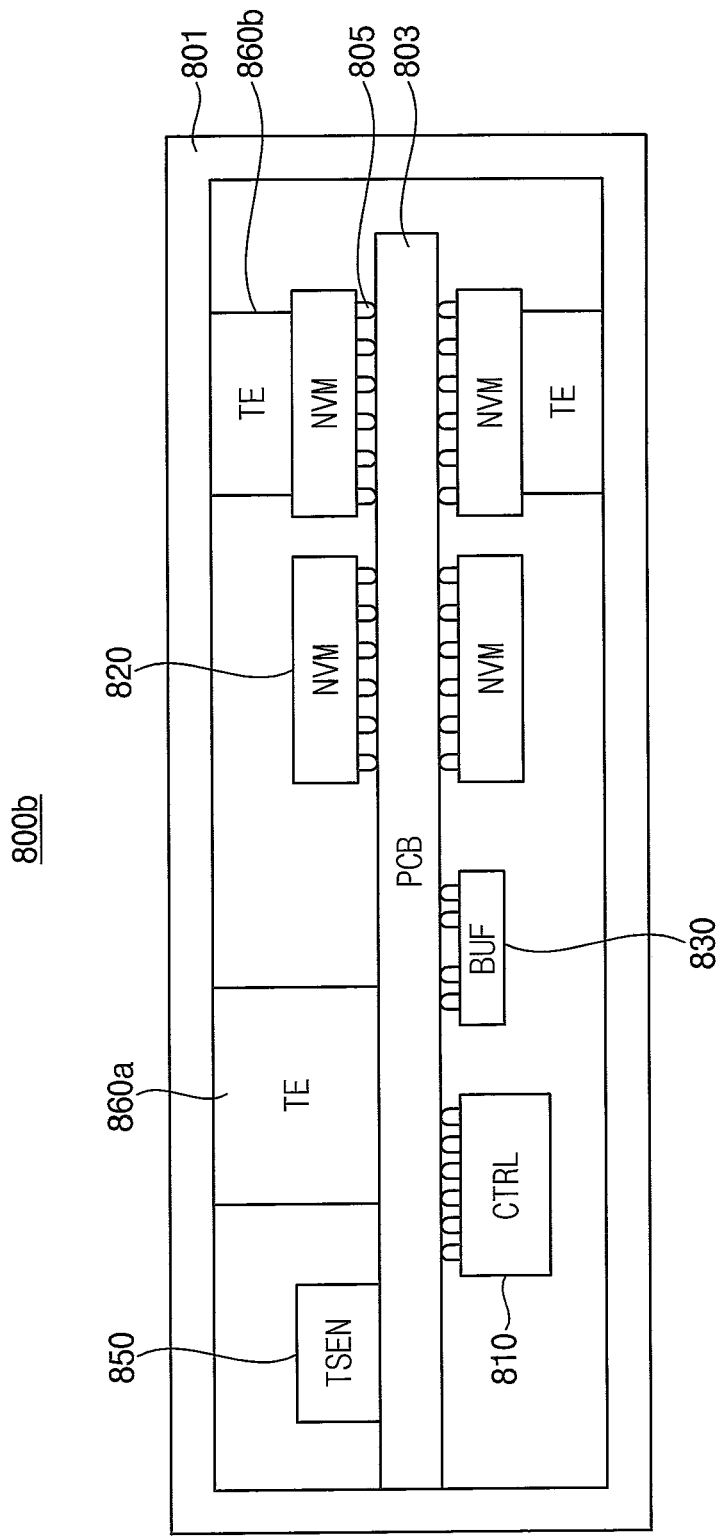
Figure 22C:
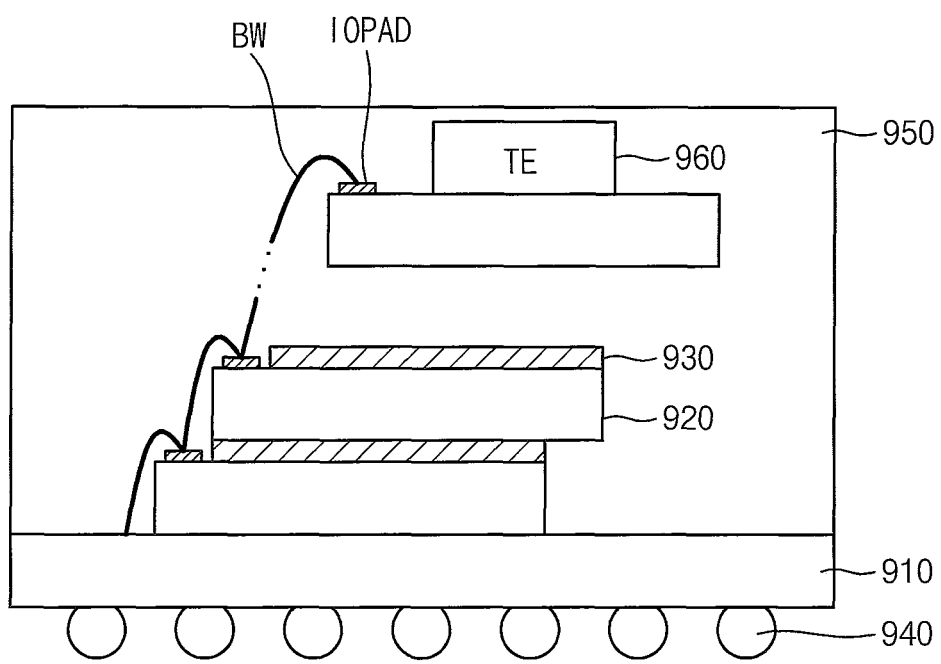

FIGS. 22A, 22B, and 22C are cross-sectional views illustrating an arrangement of a thermoelectric element included in a storage device according to an embodiment of the inventive concept.

Referring to FIG. 22A, a storage device 800a may include a case 801, a substrate 803, conductive bumps 805, and a plurality of electronic elements (or components) 810, 820, 830, 850, and 860. FIG. 22A illustrates an example where the storage device 800a is implemented as an SSD. The storage device 800a may be implemented as the storage device 300 or other storage devices described in the present disclosure.

The substrate 803 may be a single-layered or multi-layered circuit substrate including an upper surface and a lower surface opposite to each other. For example, the substrate 803 may be a printed circuit board (PCB).

The plurality of electronic elements 810, 820, 830, 850, and 860 may be mounted on the substrate 803. The plurality of electronic elements 810, 820, 830, 850, and 860 may include a storage controller (CTRL) 810, a plurality of nonvolatile memories 820, a buffer memory (BUF) 830, a temperature sensor 850, and a thermoelectric element 860 that may be implemented as the storage controller 310, the plurality of nonvolatile memories 320a, 320b, and 320c, the buffer memory 330, the temperature sensor 350, and the thermoelectric element 360 of FIG. 2, respectively. Each of the storage controller 810, the plurality of nonvolatile memories 820, and the buffer memory 830 may be provided in the form of one semiconductor package (or one semiconductor chip). In an embodiment shown by FIG. 22A, the thermoelectric element 860 may be disposed directly on the substrate 803.

The substrate 803 and the plurality of electronic elements 810, 820, 830, 850, and 860 may be fastened to the case 801 so that the substrate 803 and the plurality of electronic elements 810, 820, 830, 850, and 860 may be positioned fixedly within the case 803. At least one of the plurality of electronic elements 810, 820, 830, 850, and 860 may be mounted on the substrate 803 via the conductive bumps 805. The conductive bumps 805 may be, for example, solder bumps.

Referring to FIG. 22B, a storage device 800b may be substantially the same as the storage device 800a of FIG. 22A, except that the storage device 800b may include a plurality of thermoelectric elements including first and second thermoelectric elements 860a and 860b. Repeated description of elements described with reference to FIG. 22A will be omitted.

In an example of FIG. 22B, the first thermoelectric element 860a may be disposed directly on the substrate 803, and the second thermoelectric element 860b may be disposed on at least one nonvolatile memory of the plurality of nonvolatile memories 820 (e.g., may be disposed on the semiconductor package). In an embodiment, the first and second thermoelectric elements 860a and 860b may be disposed on the storage controller 810 and/or the buffer memory 830. In an embodiment, thermoelectric elements of the plurality of thermoelectric elements may be controlled individually and/or in groups, and may be controlled by a plurality of thermoelectric element controllers and a plurality of temperature sensors. When thermoelectric elements of the plurality of thermoelectric elements are grouped and controlled in groups, the cooling performance of each thermoelectric element of the plurality of thermoelectric elements may be controlled based on a total power of a thermoelectric element group.

Referring to FIG. 22C, a semiconductor package 900 may include a base substrate (or package substrate) 910, a plurality of semiconductor devices 920, an adhesive member 930, a plurality of conductive bumps 940, a sealing member 950, and a thermoelectric element 960. The semiconductor package 900 may be implemented as the storage controller 810, the plurality of nonvolatile memories 820, and the buffer memory 830 of FIGS. 22A and 22B.

The semiconductor devices of the plurality of semiconductor devices 920 may be sequentially stacked on the base substrate 910, and each semiconductor device of the plurality of semiconductor devices 920 may include a plurality of I/O pads IOPAD. The semiconductor devices of the plurality of semiconductor devices 920 may be electrically connected to one another and the base substrate 910 through the plurality of I/O pads IOPAD and a plurality of bonding wires BW. The thermoelectric element 960 may be disposed in the semiconductor package 900 and may be disposed on a top surface of the uppermost semiconductor device of the plurality of semiconductor devices 920.

The plurality of semiconductor devices 920 and the thermoelectric element 960 may be fixed by the sealing member 950, and the adhesive member 930 may be disposed between each adjacent pair of semiconductor devices of the plurality of semiconductor devices 920. The plurality of conductive bumps 940 may be disposed on a bottom surface of the base substrate 910 and may electrically connect to an external device.

Figure 23A:
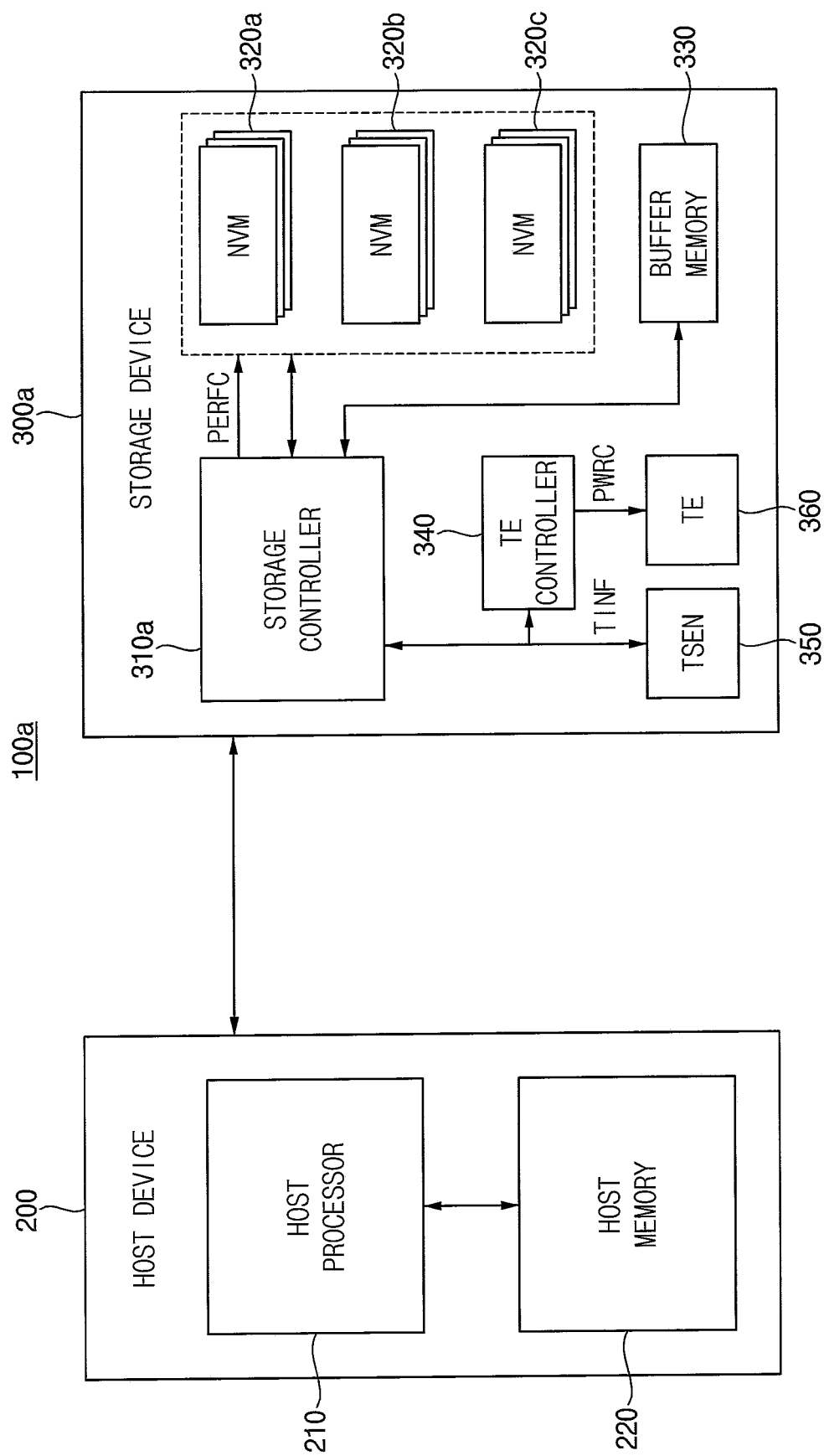
FIGS. 23A and 23B are block diagrams of a storage device and a storage system including the storage device according to an embodiment of the inventive concept.
Figure 23B:
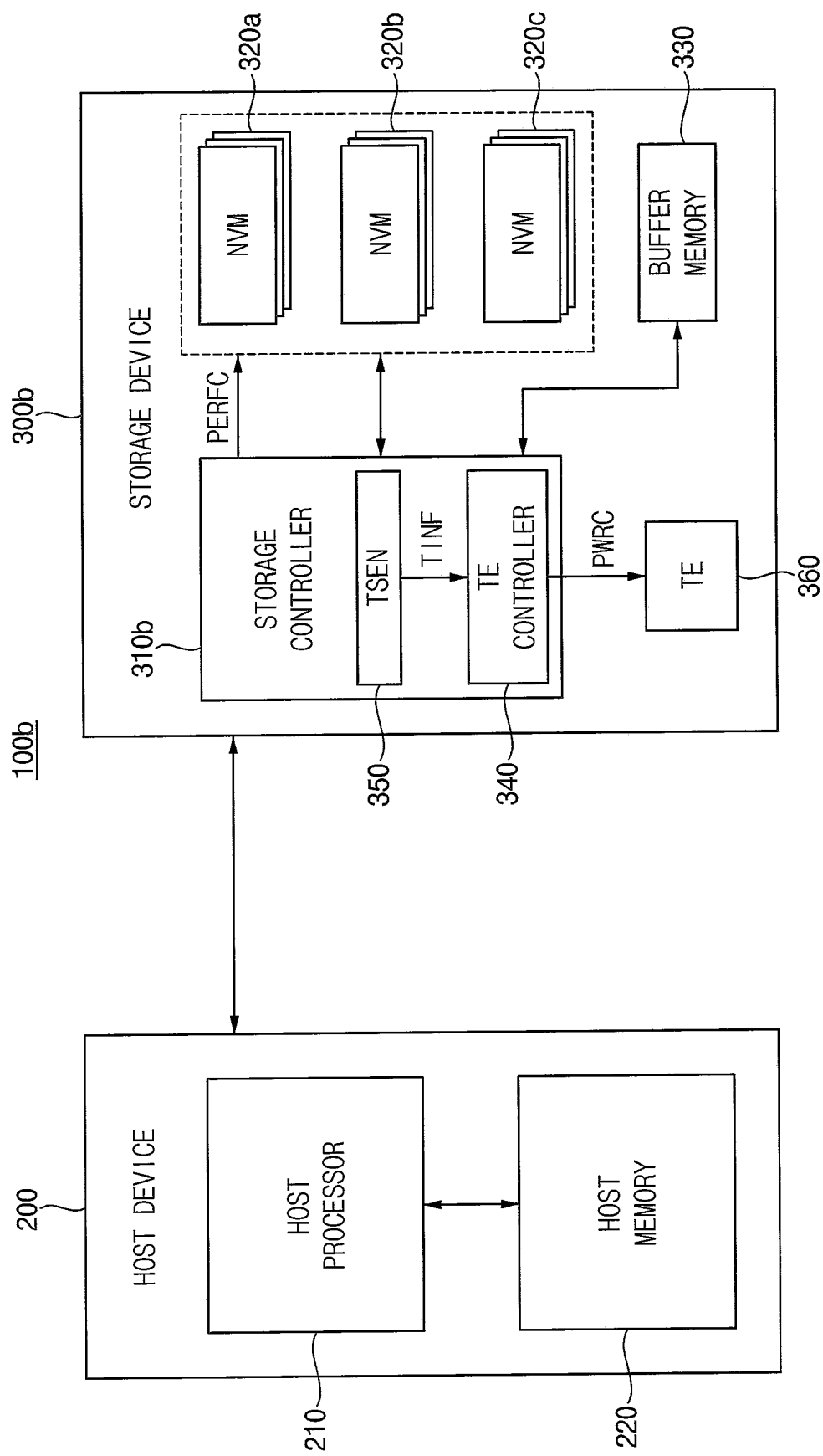

FIGS. 23A and 23B are block diagrams of a storage device and a storage system including the storage device according to an embodiment of the inventive concept. Repeated description of operations and elements described with reference to FIG. 2 will be omitted.

Referring to FIG. 23A, a storage system 100a includes a host device 200 and a storage device 300a. The storage system 100a may be substantially the same as the storage system 100 of FIG. 2, except that the thermoelectric element controller 340 included in the storage device 300a is disposed outside a storage controller 310a.

Referring to FIG. 23B, a storage system 100b includes a host device 200 and a storage device 300b. The storage system 100b may be substantially the same as the storage system 100 of FIG. 2, except that the temperature sensor 350 included in the storage device 300a is disposed inside a storage controller 310b. In an embodiment, the temperature sensor 350 may be disposed inside or within a substrate (e.g., the substrate 803 in FIG. 22A).

As will be appreciated by those skilled in the art, the inventive concept may be embodied as a system, method, computer program product, and/or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain or store a program for use by or in connection with an instruction execution system, apparatus, or device. For example, the computer readable medium may be a non-transitory computer readable medium.

Figure 24:
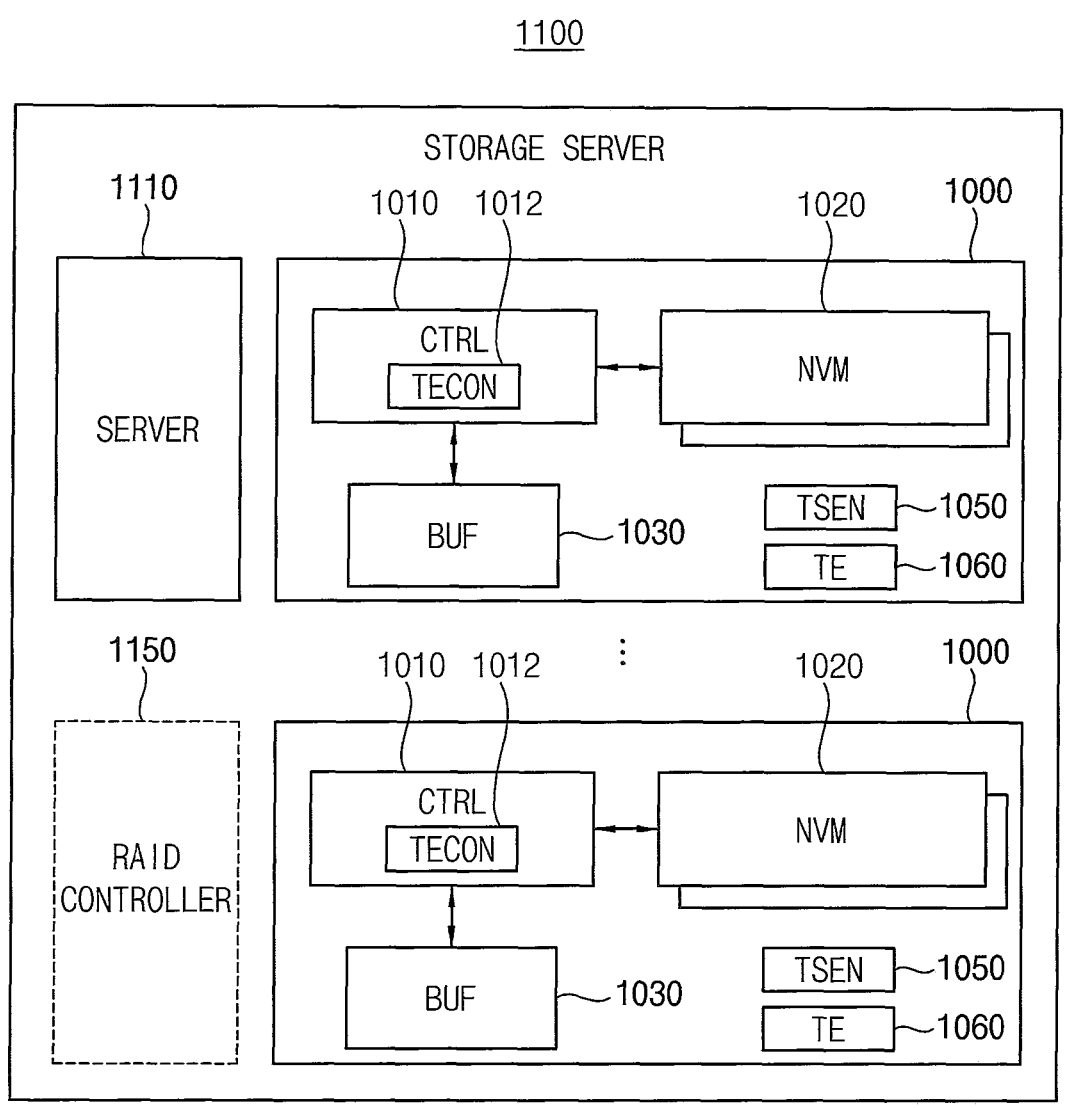
FIG. 24 is a block diagram of a storage server including a storage device according to an embodiment of the inventive concept.

FIG. 24 is a block diagram of a storage server including a storage device according to an embodiment of the inventive concept.

Referring to FIG. 24, a storage server 1100 may include a server 1110, a plurality of storage devices 1000 storing data for operating the server 1110, and a redundant array of independent drives (RAID) controller 1150 controlling the plurality of storage devices 1000.

RAID techniques are mainly used in data servers where important data can be replicated in more than one location across a plurality of storage devices. The RAID controller 1150 may enable one of a plurality of RAID levels according to RAID information, and may interface data between the server 1110 and the plurality of storage devices 1000.

Each storage drive of the plurality of storage devices 1000 may include a storage controller 1010, a plurality of nonvolatile memories 1020, a buffer memory 1030, a thermoelectric element controller (TECON) 1012, a temperature sensor 1050, and a thermoelectric element 1060. Each storage device of the plurality of storage devices 1000 may be implemented as the storage device 300 or another storage device described with reference to FIGS. 1 through 23, and may operate according to embodiments described with reference to FIGS. 1 through 23. The server 1110 may be implemented as the host device 200 and may control the plurality of storage devices 1000.

Embodiments of the inventive concept may be applied to various electronic devices and systems that include storage devices and storage systems. For example, embodiments of the inventive concept may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, or the like.

While the inventive concept has been particularly shown and described with reference to embodiments thereof, it will be understood by one of ordinary skill in the art that variations in form and detail may be made therein without departing from the spirit and scope of the inventive concept as defined by the present disclosure.

What is claimed is:

1. A method of operating a storage device, the method comprising:
    identifying one or more changes of a temperature of the storage device, wherein the one or more changes of the temperature of the storage device include a first increase of the temperature of the storage device from a first temperature to a second temperature, a second increase of the temperature of the storage device from the second temperature to a third temperature, and a third increase of the temperature of the storage device from the third temperature to a fourth temperature;
    controlling a cooling performance of a thermoelectric element included in the storage device in response to the one or more changes of the temperature of the storage device, including by:
        increasing an operating voltage of the thermoelectric element from a first voltage level to a second voltage level in response to the first increase of the temperature of the storage device, and
        increasing the operating voltage of the thermoelectric element from the second voltage level to a third voltage level in response to the third increase of the temperature of the storage device; and
    controlling a number of active channels or active ways of the storage device in response to the one or more changes of the temperature of the storage device, including by deactivating a first active channel or a first active way of the storage device.

2. The method of claim 1, wherein the one or more changes of the temperature of the storage device further include a decrease of the temperature of the storage device subsequent to an increase of the temperature of the storage device, and the method further comprises:
    decreasing the cooling performance of the thermoelectric element in response to the decrease of the temperature of the storage device; and
    activating a deactivated channel or a deactivated way of the storage device in response to the decrease of the temperature of the storage device.

3. The method of claim 1, wherein the one or more changes of the temperature of the storage device further include a first decrease of the temperature of the storage device from the third temperature to the second temperature and a second decrease of the temperature of the storage device from the second temperature to the first temperature, and the method further comprises:
    activating the deactivated first channel or the deactivated first way of the storage device in response to the first decrease of the temperature of the storage device; and
    decreasing the cooling performance of the thermoelectric element in response to the second decrease of the temperature of the storage device by decreasing the operating voltage of the thermoelectric element from the second level to a third level.

4. The method of claim 1, further comprising:
    activating a power control signal in response to the one or more changes of the temperature of the storage device;

controlling the cooling performance of the thermoelectric element in response to the activation of the power control signal;

activating a performance control signal in response to the one or more changes of the temperature of the storage device; and controlling the number of the active channels or the active ways of the storage device in response to the activation of the performance control signal.

5. The method of claim 1, further comprising:
controlling the cooling performance of the thermoelectric element by adjusting an operating voltage of the thermoelectric element.

6. The method of claim 1, wherein the one or more changes of the temperature of the storage device further include a fourth increase of the temperature of the storage device from the fourth temperature to a fifth temperature, and the method further comprises:
controlling the number of the active channels or the active ways of the storage device in response to the fourth increase of the temperature of the storage device by deactivating a second active channel or a second active way of the storage device.

7. The method of claim 1, further comprising:
deactivating a power control signal in response to the one or more changes of the temperature of the storage device;
controlling the cooling performance of the thermoelectric element in response to the deactivation of the power control signal;
deactivating a performance control signal in response to the one or more changes of the temperature of the storage device; and
controlling the number of the active channels or the active ways of the storage device in response to the deactivation of the performance control signal.

8. The method of claim 1, wherein the one or more changes of the temperature of the storage device further include a first decrease of the temperature of the storage device from the fifth temperature to a sixth temperature and a second decrease of the temperature of the storage device from the sixth temperature to a seventh temperature, and the method further comprises:
activating the deactivated second channel or the deactivated second way of the storage device in response to the first decrease of the temperature of the storage device; and
decreasing the cooling performance of the thermoelectric element in response to the second decrease of the temperature of the storage device by decreasing the operating voltage of the thermoelectric element from the third voltage level to a fourth voltage level.

9. The method of claim 8, wherein the one or more changes of the temperature of the storage device further include a third decrease of the temperature of the storage device from the seventh temperature to an eighth temperature and a fourth decrease of the temperature of the storage device from the eighth temperature to a ninth temperature, and the method further comprises:
activating the deactivated first channel or the deactivated first way of the storage device in response to the third decrease of the temperature of the storage device; and
decreasing the cooling performance of the thermoelectric element in response to the fourth decrease of the temperature of the storage device by decreasing the operating voltage of the thermoelectric element from the fourth voltage level to a fifth voltage level.

10. A storage device comprising:
a temperature sensor configured to identify a first increase of a temperature of the storage device from a first temperature to a second temperature, a second increase of the temperature of the storage device from the second temperature to a third temperature, and a third increase of the temperature of the storage device from the third temperature to a fourth temperature;
a thermoelectric element configured to perform a cooling operation for the storage device;
a thermoelectric element controller configured to:
control a cooling performance of the cooling operation of the thermoelectric element in response to the first increase of the temperature of the storage device by increasing an operating voltage of the thermoelectric element from a first voltage level to a second voltage level, and
control the cooling performance of the thermoelectric element in response to the third increase of the temperature of the storage device by increasing the operating voltage of the thermoelectric element from the second voltage level to a third voltage level; and
a storage controller configured to control a number of active channels or active ways of the storage device in response to the second increase of the temperature of the storage device by deactivating a first active channel or a first active way of the storage device.

11. The storage device of claim 10, further comprising:
a printed circuit board (PCB),
wherein the storage controller is mounted on the PCB and the thermoelectric element is disposed directly on the PCB.

12. The storage device of claim 10, further comprising:
a nonvolatile memory controlled b/the storage controller,
wherein each of the storage controller and the nonvolatile memory is included in a semiconductor package, and
wherein the thermoelectric element is disposed on the semiconductor package.

13. The storage device of claim 10, further comprising:
a nonvolatile memory controlled by the storage controller,
wherein each of the storage controller and the nonvolatile memory is included in a semiconductor package, and
wherein the thermoelectric element is disposed in the semiconductor package.

14. The storage device of claim 10, wherein the thermoelectric element controller is disposed in the storage controller.

15. The storage device of claim 10, wherein the temperature sensor is disposed in the storage controller.

16. A method of operating a storage device, the method comprising:
identifying a first increase of a temperature of the storage device from a first temperature to a second temperature, a second increase of the temperature of the storage device from the second temperature to a third temperature, a third increase of the temperature of the storage device from the third temperature to a fourth temperature, a fourth increase of the temperature of the storage device from the fourth temperature to a fifth temperature, a first decrease of the temperature of the storage device from the fifth temperature to the fourth temperature, and a second decrease of the temperature of the storage device from the fourth temperature to the third temperature;
driving a thermoelectric element included in the storage device in response to the first increase of the temperature of the storage device such that the thermoelectric element operates with a first cooling performance;

deactivating a first active channel or a first active way of the storage device in response to the second increase of the temperature of the storage device;

driving the thermoelectric element in response to the third increase of the temperature of the storage device such that the thermoelectric element operates with a second cooling performance that is greater than the first cooling performance;

deactivating a second active channel or a second active way of the storage device in response to the fourth increase of the temperature of the storage device;

activating the deactivated second channel or the deactivated second way in response to the first decrease of the temperature of the storage device; and driving the thermoelectric element in response to the second decrease of the temperature of the storage device such that the thermoelectric element operates with the first cooling performance.

17. The method of claim 16, further comprising:

identifying a third decrease of the temperature of the storage device from the third temperature to the second temperature and a fourth decrease of the temperature of the storage device from the second temperature to the first temperature;

activating the deactivated first channel or the deactivated first way in response to the third decrease of the temperature of the storage device; and driving the thermoelectric element in response to the fourth decrease of the temperature of the storage device such that the thermoelectric element operates with an initial cooling performance that is less than the first cooling performance.

* * * * *